United States Patent
Kawai et al.

(10) Patent No.: US 10,094,882 B2
(45) Date of Patent: Oct. 9, 2018

(54) APPARATUS FOR PREDICTING POWER PARAMETER OF SECONDARY BATTERY

(71) Applicant: DENSO CORPORATION, Kariya, Aichi-pref (JP)

(72) Inventors: Toshiyuki Kawai, Kariya (JP); Yuuji Koike, Kariya (JP); Keiichi Kato, Kariya (JP)

(73) Assignee: DENSO CORPORATION, Kariya (JP)

( * ) Notice: Subject to any disclaimer, the term of this patent is extended or adjusted under 35 U.S.C. 154(b) by 179 days.

(21) Appl. No.: 14/979,848

(22) Filed: Dec. 28, 2015

(65) Prior Publication Data

US 2016/0187429 A1    Jun. 30, 2016

(30) Foreign Application Priority Data

Dec. 26, 2014  (JP) ................. 2014-266239
Sep. 14, 2015  (JP) ................. 2015-181049

(51) Int. Cl.
*G01R 31/36*    (2006.01)

(52) U.S. Cl.
CPC ..... *G01R 31/3651* (2013.01); *G01R 31/3662* (2013.01); *G01R 31/3658* (2013.01)

(58) Field of Classification Search
CPC ............ G01R 31/3651; G01R 31/3662; G01R 31/3658
USPC .......................................................... 702/63
See application file for complete search history.

(56) References Cited

U.S. PATENT DOCUMENTS

2013/0110429 A1*  5/2013  Mitsuyama ........... H01M 10/48
                                                          702/63

FOREIGN PATENT DOCUMENTS

| JP | 2004-079472 A | 3/2004 |
| JP | 2009-204320 A | 9/2009 |
| JP | 2010-203885 A | 9/2010 |
| JP | 4788307 B2    | 10/2011 |

OTHER PUBLICATIONS

Kuhn et al., "Modelling Ni-mH Battering Using Cauer and Foster Structures," Journal of Power Sources, 2006, vol. 58, pp. 1490-1497.

* cited by examiner

*Primary Examiner* — Fernando Hidalgo
(74) *Attorney, Agent, or Firm* — Oliff PLC

(57) ABSTRACT

In an apparatus, a circuit model includes a DC resistance model, and a reaction impedance model having a nonlinear relationship between a first potential difference across a reaction resistance and a current flowing through the secondary battery. The nonlinearly relationship depends on a temperature of the secondary battery. The circuit model includes a diffusion impedance model. The apparatus predicts a future remaining voltage across the secondary battery at a future timing when a predetermined duration will have elapsed since a prediction time. The apparatus calculates a future polarization voltage across the secondary battery at the future timing. The apparatus predicts a target power parameter of the secondary battery at the future timing according to the future remaining voltage, the future polarization voltage, a first potential difference across the reaction resistance, and a second potential difference across the DC resistance model.

14 Claims, 10 Drawing Sheets

EMBODIMENT

APPARATUS FOR PREDICTING POWER PARAMETER OF SECONDARY BATTERY

CROSS REFERENCE TO RELATED APPLICATIONS

This application is based on and claims the benefit of priority from Japanese Patent Applications 2014-266239 and 2015-181049 respectively filed on Dec. 26, 2014 and Sep. 14, 2015, the disclosure of each of which is incorporated in its entirety herein by reference.

TECHNICAL FIELD

The present disclosure relates to apparatuses for predicting a target power parameter of a secondary battery using an equivalent circuit model of the secondary battery.

BACKGROUND

There is a technology for predicting, i.e. calculating, maximum inputtable power and maximum outputtable power as power parameters correlating with the output of a secondary battery, which is disclosed in, for example, Japanese Patent Publication No. 4788307. The technology disclosed in the Patent Publication predicts sustainable maximum inputtable power to second battery and sustainable maximum outputtable power from the secondary battery using an equivalent circuit model of the secondary battery. The equivalent circuit model, which consists of a single resistor and a single RC parallel circuit connected in series thereto, simulates the electrical consequences of the chemical reactions inside the secondary battery. The following describes the equivalent circuit model consisting of the single resistor and single RC parallel circuit as a single RC circuit model. The single resistor represents a charge-transfer resistance, and the single RC parallel circuit represents an RC parallel circuit comprised of a purely resistance and a double-layer capacitance connected in parallel thereto.

The following describes an example of how the known technology predicts sustainable maximum outputtable power for a secondary battery while the secondary battery is discharged.

First, the known technology collectively predicts unknown values of predetermined parameters representing the single RC circuit model of the secondary battery using an adaptive digital filter. Next, the known technology predicts, according to the predicted values of the parameters, a voltage across the positive and negative terminals of the secondary battery at the time when the secondary battery has been discharged for a predetermined time. Then, the known technology calculates a maximum output current when the voltage across the positive and negative terminals of the secondary battery becomes a predetermined minimum available voltage. Thereafter, the known technology calculates the product of the maximum output current and the minimum available voltage as the maximum outputtable power for the secondary battery.

SUMMARY

Common secondary batteries have current-voltage characteristics that nonlinearly change in a low-temperature region of the secondary batteries.

Unfortunately, the above structure of the single RC circuit model disclosed in the known technology may have difficulty in expressing, with high accuracy, the electrochemical behavior of a secondary battery while the current-voltage characteristics of the secondary battery nonlinearly change. In particular, the level of the nonlinearly change of the current-voltage characteristics may become too large to ignore at temperatures of the secondary battery below 0 degrees. The known technology using the single RC circuit model therefore may reduce the accuracy of predicting the maximum inputtable power to the secondary battery and the maximum outputtable power from the secondary battery in the low temperature regions.

In view of the circumstances set forth above, one aspect of the present disclosure seeks to provide an apparatus for predicting a target power parameter of a secondary battery with a higher accuracy even in a low-temperature region of the secondary battery.

According to a first exemplary aspect of the present disclosure, there is provided an apparatus for predicting a target power parameter of a secondary battery, the apparatus includes a first polarization voltage calculator that uses an equivalent circuit model of the secondary battery to calculate a present polarization voltage across the secondary battery at a specified prediction time. The equivalent circuit model includes a DC resistance model representing a DC resistance of the secondary battery, and a reaction impedance model representing a reaction resistance of the secondary battery. The reaction impedance model has a nonlinear relationship between a first potential difference across the reaction resistance and the current flowing through the secondary battery. The nonlinearly relationship depends on a temperature of the secondary battery. The equivalent circuit model includes a diffusion impedance model representing a diffusion impedance of the secondary battery and including at least one RC parallel circuit. The at least one RC parallel circuit includes a diffusion resistance and a diffusion capacitance connected in parallel to each other. The DC resistance model, the reaction impedance model, and the diffusion impedance model are connected in series to each other. The first polarization voltage calculator calculates the present polarization voltage across the secondary battery in accordance with a predetermined function defined among the present polarization voltage, the diffusion resistance, and the diffusion capacitance. The apparatus includes a remaining voltage predictor that predicts, in accordance with a first continuous time-domain function, a future remaining voltage across the secondary battery at a future timing when a predetermined duration will have elapsed since the specified prediction time for the target power parameter. The first continuous time-domain function is defined among the diffusion resistance, the diffusion capacitance, the present polarization voltage, and the future remaining voltage. The apparatus includes a second polarization voltage calculator that calculates, in accordance with a second continuous time-domain function, a future polarization voltage across the secondary battery at the future timing when the predetermined duration will have elapsed since the specified prediction time. The second continuous time-domain function is defined among the future polarization voltage, the diffusion resistance, and the diffusion capacitance. The apparatus includes a target power parameter predictor that predicts a value of the target power parameter at the future timing when the predetermined duration will have elapsed since the specified prediction time in accordance with the future remaining voltage, the future polarization voltage, the first potential difference across the reaction resistance, and a second potential difference across the DC resistance model.

According to a second exemplary aspect of the present disclosure, there is provided an apparatus for predicting a target power parameter of a secondary battery. The apparatus includes a current sensor that measures a current flowing through the secondary battery, and a target power parameter predictor that uses an equivalent circuit model of the secondary battery to calculate a value of the target power parameter at a specified prediction time. The equivalent circuit model includes a DC resistance model representing a DC resistance of the secondary battery, and a reaction impedance model representing a reaction resistance of the secondary battery. The reaction impedance model has a nonlinear relationship between a first potential difference across the reaction resistance and the current flowing through the secondary battery. The nonlinearly relationship depends on a temperature of the secondary battery. The equivalent circuit model includes a diffusion impedance model representing a diffusion impedance of the secondary battery and including a plurality of RC parallel circuits. Each of the RC parallel circuits includes a diffusion resistance and a diffusion capacitance connected in parallel to each other. The DC resistance model, the reaction impedance model, and the diffusion impedance model are connected in series to each other. The target power parameter predictor predicts a value of the target power parameter as a function of: the DC resistance of the DC resistance model; the reaction resistance of the reaction impedance model; the diffusion resistance and the diffusion capacitance of each of the RC parallel circuits; and the current measured by the current sensor.

The reaction impedance model of the equivalent circuit model of the secondary battery according to each of the first exemplary aspect and the second exemplary aspect has the nonlinear relationship between the first potential difference across the reaction resistance and the current flowing through the secondary battery, and the nonlinearly relationship depends on the temperature of the secondary battery. For this reason, the equivalent circuit model of the secondary battery enables the nonlinear current-voltage characteristics of the secondary battery to be expressed with a higher accuracy. The target power parameter calculator uses the reaction resistance of the secondary battery for predicting a value of the target power parameter, resulting in a predicted value of the target power parameter of the secondary battery having a higher accuracy.

Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Figure 1:
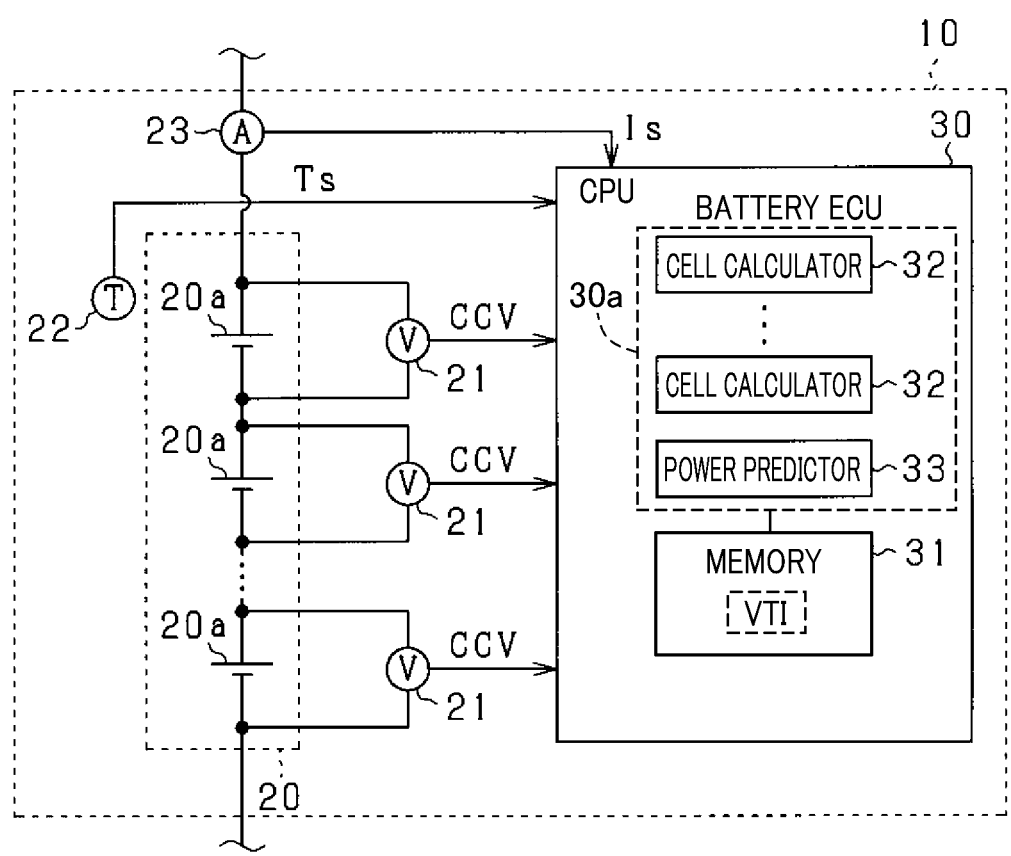
FIG. 1 is a circuit diagram schematically illustrating an example of the configuration of a battery system according to an embodiment of the present disclosure.

The following describes an embodiment of the present disclosure with reference to the accompanying drawings. In the drawings, identical reference characters are utilized to identify identical corresponding components.

FIG. 1 illustrates a battery system 10 according to the embodiment of the present disclosure. The battery system 10 incorporates an apparatus for calculating a power parameter of a secondary battery, i.e. a battery pack 20, according to the embodiment. Note that the battery system 10 of the embodiment is capable of supplying power of the battery pack 20 to external devices; the external devices include, for example, a vehicle equipped with a rotary electric machine, i.e. a motor-generator, serving as a main engine of the vehicle. The battery system 10 of the embodiment also serves as an auxiliary battery installed in a vehicle equipped with an idle reduction system using an auxiliary battery.

Referring to FIG. 1, the battery system 10 includes the battery pack 20 and a battery electronic control unit (ECU) 30. The battery pack 20 includes a plurality of cells 20a connected in series to each other. The battery pack 20 is connected to electrical loads including a power generator, such as a motor-generator. The battery pack 20 is capable of supplying power to the electrical loads, and receiving power supplied from, for example, the power generator. The embodiment uses a rechargeable battery cell, such as a lithium-ion secondary battery cell, as each cell 20a.

As skilled persons in the art know well, each of the battery cells 20a schematically includes a positive electrode, a negative electrode, an electrolyte, and a separator separating the positive electrode and the negative electrode in the electrolyte. Electrochemical reactions take place in the electrolyte of the corresponding battery cell, resulting in a current flowing through the electrical loads connected to the battery pack 20.

The above-configured battery cell 20a inherently has internal impedance.

The internal impedance includes, for example, direct-current (DC) impedance, reaction impedance, and diffusion impedance.

The DC impedance includes the resistances of the positive and negative electrodes and the resistance of the electrolyte of the battery cell 20a.

The reaction impedance includes a pair of a reaction resistance, and an electric double layer capacitance connected in parallel to the reaction resistance. The reaction resistance and the electric double layer capacitance are based on, for example, ions, i.e. lithium ions, in the electrolyte and electrical charges in the positive electrode at their interface, and reactions between ions in the electrolyte and electrical charges in the negative electrode at their interface.

The diffusion impedance includes a diffusion resistance and a diffusion capacitance connected in parallel to the diffusion resistance. The diffusion resistance and the diffusion capacitance are based on, for example, diffusions of ions in the electrolyte and diffusions of ions in the active material of each of the positive and negative electrodes. The diffusion capacitance expresses the change of the diffusion resistance over time.

The battery system 10 also includes a plurality of voltage sensors 21, a temperature sensor 22, and a current sensor 23, which are examples of various sensors capable of measuring various physical characteristics of the battery pack 20.

Each of the voltage sensors 21 is configured to measure a voltage CCV across a corresponding one of the battery cells 20a, and output a measurement signal indicative of the voltage CCV across a corresponding one of the battery cells 20a to the battery ECU 30. The voltage CCV across a battery cell 20a will also be referred to as a terminal voltage CCV of the battery cell 20a. The temperature sensor 22 is configured to detect a temperature Ts of the battery pack 20, i.e. a temperature Ts of each battery cell 20a, and output a measurement signal indicative of the temperature Ts, which will be referred to as a cell temperature Ts, of each battery cell 20a to the battery ECU 30. The current sensor 22 is configured to measure a current Is flowing through the battery pack 20, and output a measurement signal indicative of the measured current Is to the battery ECU 30.

The battery ECU 30 includes, for example, a well-known microcomputer, which is comprised of, for example, a CPU 30a, a storage, i.e. a memory, 31, an unillustrated I/O, and other peripheral devices. The storage 31 stores various routines, i.e. various sets of instructions, including a first routine for calculating the state of charge (SOC) of each of the battery cells 20a and a second routine for predicting allowable input power to the battery pack 20 and allowable output power from the battery pack 20. The first routine will also be referred to as, for example, an SOC calculation routine for calculating the SOC of each battery cell 20a as a power parameter of the corresponding battery cell 20a. The second routine will also be referred to as, for example, an allowable-power prediction routine for predicting the allowable input power to the battery pack 20 and allowable output power from the battery pack 20 as the power parameters of the battery pack 20. For example, the CPU 30a is capable of running the various programs to perform corresponding routines.

For example, the storage 31 of the embodiment stores various types of information VTI correlating with various characteristic parameters of the battery pack 20 described later.

The battery ECU 30, i.e. the CPU 30a, is capable of predicting allowable input power Win to the battery pack 20 and allowable output power Wout from the battery pack 20 using, for example, the characteristic parameters stored in the storage 31 and the measurement signals input from the voltage sensors 20, temperature sensor 21, and current sensor 22.

For example, the CPU 30a functionally includes a plurality of cell calculators 32 and a power predictor 33. In other words, the CPU 30a serves as each cell calculator 32 to run the SOC calculation routine, thus performing a characteristic-parameter calculation task. The CPU 30a also serves as the power predictor 33 to run the allowable-power predicting routine, thus performing a power prediction task. The power prediction task is to predict the allowable input power Win to the battery pack 20 and allowable output power Wout from the battery pack 20.

Each cell calculator 32 is configured to perform one calculation task at the period of, for example, 0.1 seconds, and the power predictor 33 is configured to perform one power prediction task at the period of, for example, 0.1 seconds. The period of the calculation task will be referred to as a task period hereinafter.

The following describes how each of the cell calculators 32 performs the calculation task first, and describes how the power predictor 33 performs the power prediction task next.

Figure 2:
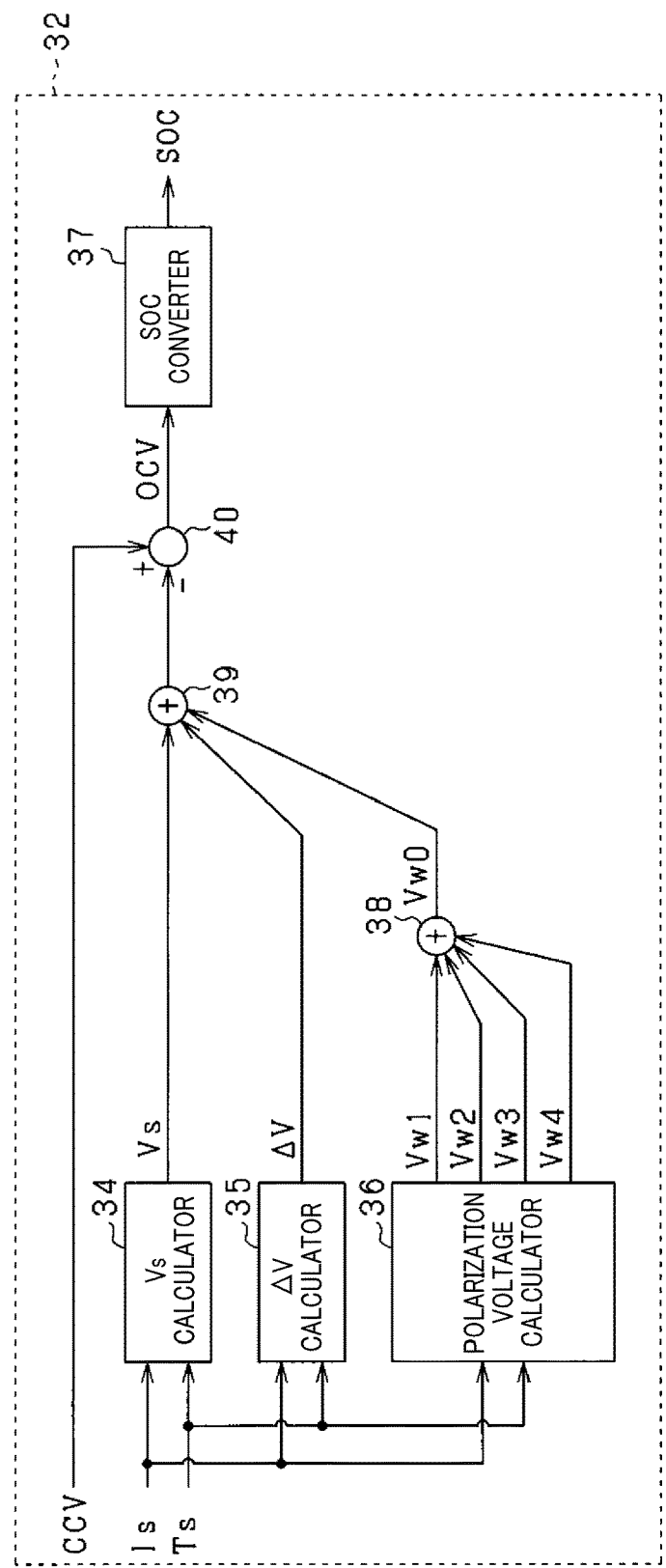
FIG. 2 is a functional block diagram schematically illustrating an example of a cell calculator illustrated in FIG. 1.

Referring to FIG. 2, each of the cell calculators 32 includes a first potential difference calculator, which is illustrated as a Vs calculator, 34, a second potential difference calculator, which is illustrated as a $\Delta V$ calculator, 35, a polarization voltage calculator 36, a SOC converter 37, a first adder 38, a second adder 39, and an open-circuit-voltage (OCV) calculator 40. The polarization voltage calculator 36 is operatively linked to the first adder 38, and the Vs calculator 34, the $\Delta V$ calculator 35, and the first adder 38 are operatively linked to the second adder 39. The second adder 39 is operatively linked to the OCV calculator 40, and the OCV calculator 40 is operatively linked to the SOC converter 37.

Each of the Vs calculator 34, $\Delta V$ calculator 35, and polarization voltage calculator 36 calculates one or more characteristic parameters associated with the corresponding battery cell 20a using an equivalent circuit model 45 of the corresponding battery cell 20a.

Figure 3:
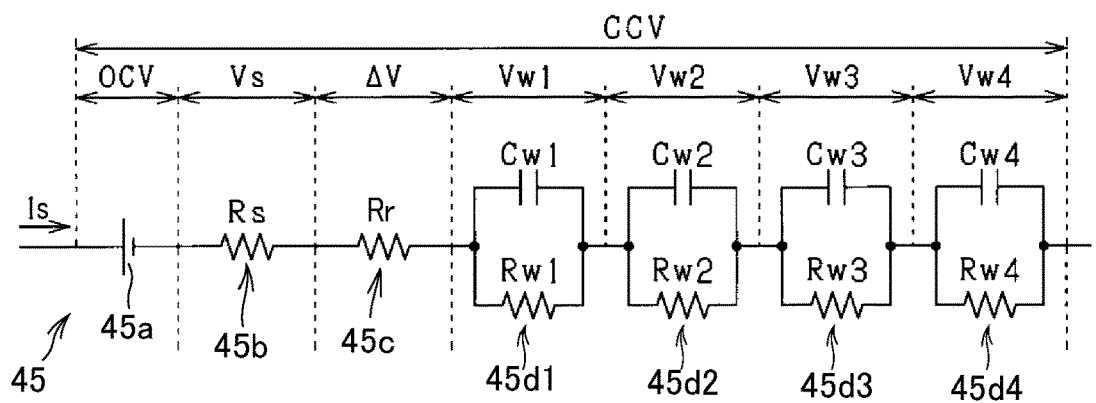
FIG. 3 is a circuit diagram schematically illustrating an example of the configuration of an equivalent circuit model of a battery cell illustrated in FIG. 1 according to the embodiment of the present disclosure.

As shown in FIG. 3, the equivalent circuit model 45 shows, for example, the internal impedance of the battery cell 20a, thus equivalently simulating the electrochemical behavior of the battery cell 20a.

Specifically, the equivalent circuit model 45 includes a power source 45a having a terminal voltage matching with an open circuit voltage (OCV) across the battery cell 20a. The equivalent circuit model 45 also includes a DC resistance model 45b, a reaction impedance model 45c, and a diffusion impedance model 45d. The power source 45a, the DC resistance model 45b, the reaction impedance model 45c, and the diffusion impedance model 45d are connected in series to each other.

The DC resistance model 45b represents the DC resistance of the battery cell 20a. Specifically, the DC resistance model 45b is comprised of a DC resistance Rs modelling the combination of the resistances of the positive and negative electrodes and the resistance of the electrolyte of the battery cell 20a.

The reaction impedance model 45c represents the reaction impedance of the battery cell 20a. Specifically, the reaction impedance model 45c is comprised of a reaction resistance Rr modelling the reaction impedance of the battery cell 20a. That is, the embodiment regards the reaction impedance of the battery cell 20a as only the reaction resistance Rr. In other words, the electric double layer capacitance of the reaction impedance of the battery cell 20a according to the embodiment can be ignored. This is because the task period of one calculation task of each cell calculator 32, which is set to be 0.1 seconds, is sufficiently longer than the time constant of the RC parallel circuit of the reaction impedance of the battery cell 20a, so that the time constant of the RC parallel circuit can be ignored.

The diffusion impedance model 45d represents the diffusion impedance of the battery cell 20a. Specifically, the diffusion impedance model 45d includes a plurality of RC parallel circuits, for example, four RC parallel circuits 45d1, 45d2, 45d3, and 45d4 connected in series to each other; these RC parallel circuits 45d1, 45d2, 45d3, and 45d4 model the diffusion impedance of the battery cell 20a. That is, the diffusion impedance model 45d is designed as a foster equivalent circuit.

Each of the RC parallel circuits 45d1, 45d2, 45d3, and 45d4 is comprised of a diffusion resistance component and a diffusion capacitance component connected in parallel to the diffusion resistance component. The diffusion resistance components of the RC parallel circuits 45d1, 45d2, 45d3, and 45d4, individually referred to as Rw1, Rw2, Rw3, and Rw4, serve as resistance components in the diffusion resistance of the battery cell 20a. Similarly, the diffusion capacitance components of the RC parallel circuits 45d1, 45d2, 45d3, and 45d4, individually referred to as Cw1, Cw2, Cw3, and Cw4, serve as the diffusion capacitance of the battery cell 20a. The diffusion capacitance components Cw1, Cw2, Cw3, and Cw4 serve to express changes of the respective diffusion resistance components Rw1, Rw2, Rw3, and Rw4 over time.

The diffusion resistance components Rw1, Rw2, Rw3, and Rw4 will be respectively referred to as first, second, third, and fourth resistance components Rw1, Rw2, Rw3, and Rw4, and the diffusion capacitance components Cw1, Cw2, Cw3, and Cw4 will be respectively referred to as first, second, third, and fourth resistance components Cw1, Cw2, Cw3, and Cw4.

In FIG. 3, reference character Vs represents a potential difference, i.e. a voltage, across the DC resistance Rs, reference character $\Delta V$ represents a potential difference, i.e. a voltage, across the reaction resistance Rr. Similarly, in FIG. 3, reference characters Vw1, Vw2, Vw3, and Vw4 individually represent first, second, third, and fourth polarization voltages across the respective RC parallel circuits 45d1, 45d2, 45d3, and 45d4, and reference character I represents a current flowing through the equivalent circuit model 45.

Figure 4:
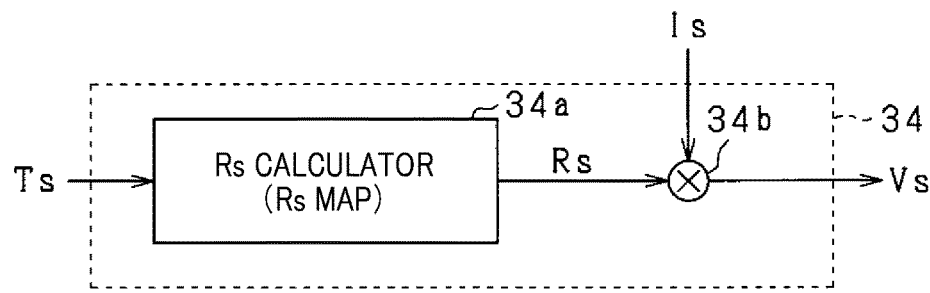
FIG. 4 is a schematic block diagram of a Vs calculator of the cell calculator.

The following describes how the Vs calculator 34 works using FIG. 4.

The Vs calculator 34 includes an Rs calculator 34a and a multiplier 34b operatively linked to the Rs calculator 34a.

The Rs calculator 34a calculates a value of the DC resistance Rs as a function of the cell temperature Ts of the battery cell 20a measured by the temperature sensor 22. The reason why the Rs calculator 34a uses the cell temperature Ts of the battery cell 20a in calculating the DC resistance Rs is that the DC resistance Rs depends on the cell temperature Ts of the battery cell 20a.

For example, the storage 31 stores Rs map information as part of the information VTI. The Rs map information represents the correlations between the DC resistance Rs and the cell temperature Ts of the battery cell 20a. For example, experiments using the actual battery cell 20a enable the Rs map information to be measured, so that the measured Rs map information is stored in the storage 31. The Rs map information for example shows that the DC resistance Rs decreases with an increase of the cell temperature Ts.

For example, the Rs calculator 34a refers to the Rs map information using the value of the cell temperature Ts measured by the temperature sensor 22, thus extracting a value of the DC resistance Rs matching with the measured value of the cell temperature Ts.

The multiplier 34b multiplies the value of the DC resistance Rs calculated by the Rs calculator 34a by the current Is measured by the current sensor 22, thus calculating a value of the potential difference Vs across the DC resistance Rs. The potential difference Vs across the DC resistance Rs will also be referred to as a DC-resistance potential difference Vs hereinafter.

Note that the polarity of the measured current Is is set to be negative when the measured current Is is flowing out of the battery pack 20 so that the battery cell 20a is discharged, and to be positive when the measured current Is is flowing into the battery pack 20 so that the battery cell 20a is charged. This results in the polarity of the potential difference Vs across the DC resistance Rs being negative when the battery cell 20a is discharged, and being positive when the battery cell 20a is charged.

Figure 5:
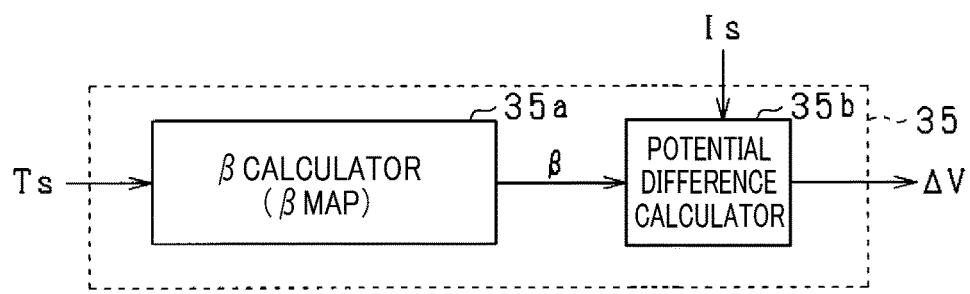
FIG. 5 is a schematic block diagram of a ΔV calculator of the cell calculator.

The following describes how the $\Delta V$ calculator 35 works using FIG. 5.

The $\Delta V$ calculator 35 includes a $\beta$ calculator 35a and a potential difference calculator 35b operatively linked to the $\beta$ calculator 35a.

The $\beta$ calculator 35a calculates a value of a parameter $\beta$ correlating with the reaction resistance Rr of the battery cell 20a as a function of the cell temperature Ts of the battery cell 20a measured by the temperature sensor 22. The parameter $\beta$ correlating with the reaction resistance Rr of the battery cell 20a will be referred to as a reaction-resistance parameter $\beta$. The reason why the $\beta$ calculator 35a uses the cell temperature Ts of the battery cell 20a in calculating the reaction-resistance parameter $\beta$ is that the reaction-resistance parameter $\beta$ depends on the cell temperature Ts of the battery cell 20a.

For example, the storage 31 stores $\beta$ map information as part of the information VTI. The $\beta$ map information represents the correlations between the natural logarithm (log) of the reaction-resistance parameter $\beta$, which will be referred to as ln $\beta$, and the absolute temperature T of the battery cell 20a obtained based on the cell temperature Ts of the battery cell 20a. For example, experiments using the actual battery cell 20*a* enable the β map information to be measured, so that the measured β map information is stored in the storage 31.

The following describes the reaction-resistance parameter β in detail.

The Butler-Volmer equation, which is one of the most fundamental relationships in electrochemical kinetics, for each battery cell 20*a* is given by the following equation [eq1]:

$$i = i_o \left\{ \exp\left(\frac{knF\eta}{RT}\right) - \exp\left(\frac{-(1-k)nF\eta}{RT}\right) \right\} \quad [\text{eq 1}]$$

Where
(1) i represents an electrode current density
(2) $i_o$ represents an exchange current density
(3) k represents oxidation electrode-reaction transfer coefficient
(4) n represents the number of electrons
(5) F represents Faraday constant
(6) η represents overpotential
(7) R represents gas constant
(8) T represents the absolute temperature of the battery cell 20*a*.

Supposing that the charge-discharge efficiency of the positive electrode is equivalent to that of the negative electrode so that k=1−k is satisfied, the following equation [eq2] is derived from the equation [eq1]:

$$i = i_o \left\{ \exp\left(\frac{anF\eta}{RT}\right) - \exp\left(\frac{-anF\eta}{RT}\right) \right\} \quad [\text{eq 2}]$$

Where a represents k=1−k.

Transforming the equation [eq2] based on the relationship between hyperbolic sine function and exponential function derives the following equation [eq3]:

$$i = 2 \cdot i_o \cdot \sinh\left(\frac{anF\eta}{RT}\right) \quad [\text{eq 3}]$$

Solving the equation [eq3] in view of the overpotential η derives the following equation [eq4]:

$$\eta = \frac{RT}{anF} \sinh^{-1}\left(\frac{1}{2 \cdot io} i\right) \quad [\text{eq 4}]$$

Additionally, the relationship between the overpotential η and the potential difference ΔV across the reaction resistance Rr using a proportional constant, i.e. an adaptive constant, γ is expressed as the following equation [eq5]:

$$\eta = \gamma \cdot \Delta V \quad [\text{eq 5}]$$

The relationship between the current density i and a current I flowing through the battery cell 2*a* using the proportional constant γ is also expressed as the following equation [eq6]:

$$i = \gamma \cdot I \quad [\text{eq 6}]$$

Substituting the equations [eq5] and [eq6] into the equation [eq4] derives the following equation [eq7]:

$$\gamma \cdot \Delta V = \frac{RT}{anF} \sinh^{-1}\left(\frac{1}{2 \cdot io} \gamma \cdot I\right) \quad [\text{eq 7}]$$

Arranging the equation [eq7] derives the following equation [eq8]:

$$\Delta V = \frac{\alpha}{\gamma} T \cdot \sinh^{-1}(\beta \cdot \gamma \cdot I) \quad [\text{eq 8}]$$

Where $\alpha = \frac{R}{anF}$, and $\beta = \frac{1}{2 \cdot io}$

In the equation [eq8], β represents the above reaction-resistance parameter, α represents a constant value, and γ represents the adaptive constant. The equation [eq8] shows that the reaction-resistance parameter β enables the current I, which flows through the battery cell 2*a* as a charging current or a discharge current, to correlate with the potential difference ΔV across the reaction resistance Rr. Note that the first embodiment enables the measured current Is to be regarded as the current I flowing through the battery cell 2*a*.

The equation [eq8] reveals that the reaction-resistance parameter β derived from the Butler-Volmer equation serves as a coefficient defining the relationship between an inverse hyperbolic function and the potential difference ΔV across the reaction resistance Rr. The inverse hyperbolic function has the current I, which flows through the battery cell 2*a*, as an independent variable, and the potential difference ΔV across the reaction resistance Rr as a dependent variable.

As skilled persons in the art know well, the exchange current density io can be expressed in the following equation [eq8a]:

$$io = iC \cdot \exp\left(-\frac{K}{T}\right) \quad [\text{eq 8a}]$$

Where iC and K respectively represent predetermined constants.

Because the reaction-resistance parameter β is proportional to the reciprocal of the exchange current density io, the reaction-resistance parameter β can be expressed as the following equation [eq8b]:

$$\beta = \beta 0 \cdot \exp\left(-\frac{K}{T}\right) \quad [\text{eq 8b}]$$

Where β0 represents a predetermined constant.

That is, the reaction-resistance parameter β depends on the absolute temperature T, so that the reaction-resistance parameter β also depends on the absolute temperature T.

Taking the natural logarithm of both sides of the equation [eq8b] yields the following equation [eq8c]:

$$\ln(\beta) = \ln(\beta 0) + K \times \left(\frac{1}{T}\right) \quad [\text{eq 8c}]$$

This equation [eq8c] has the same form as the following equation [eq8d] as a linear function:

$$Y = AX + B \quad [\text{eq 8d}]$$

Where A is K, and B is ln(β0).

Figure 6:
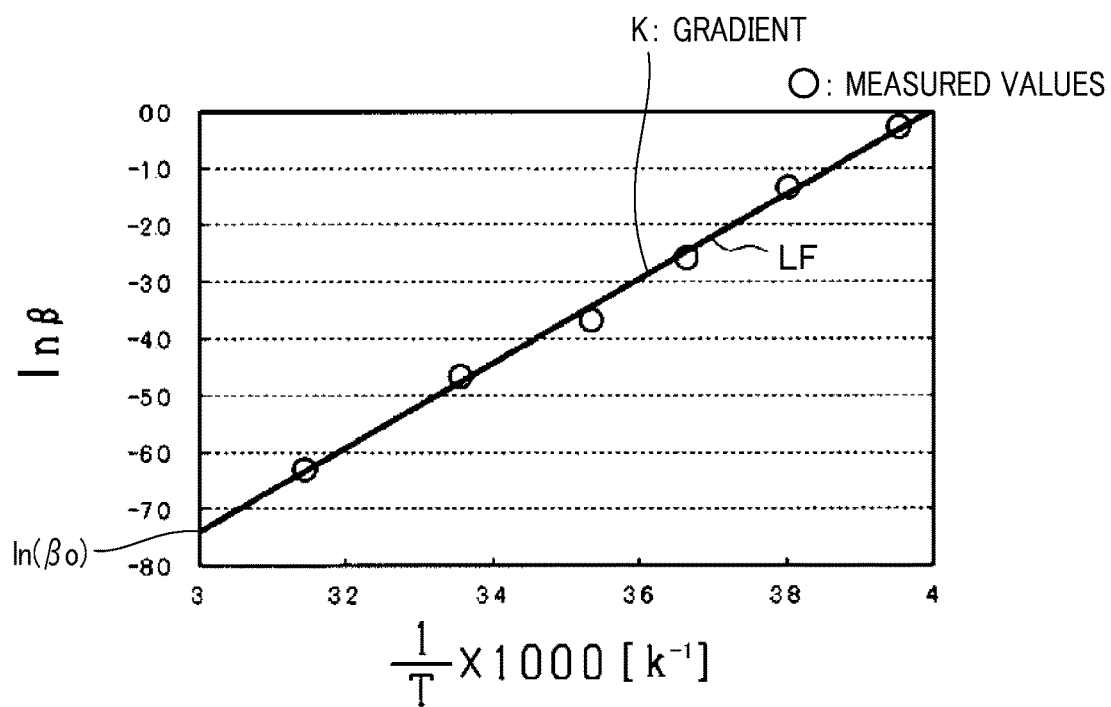
FIG. 6 is a graph schematically illustrating a natural logarithm of a reaction-resistance parameter versus corresponding values of the reciprocal of an absolute temperature of a battery cell according to the embodiment.

On the basis of the relationships, measured values of the natural logarithm ln(β) of the reaction-resistance parameter β versus corresponding values of the reciprocal of the absolute temperature T of the battery cell 20a are plotted in the graph having ln(β) as its Y axis and 1/T as its X axis as illustrated in FIG. 6. The embodiment obtains a linear function LF that is fit to the plotted measured values of the natural logarithm ln(β) of the reaction-resistance parameter β with respect to the reciprocal of the absolute temperature T of the battery cell 20a (see FIG. 6). This enables a value of ln(β0) to be obtained as the y-intersect of the linear function LF, and a value of K to be obtained as the gradient of the linear function LF.

Thus, the storage 31 stores the linear function LF, i.e. the set of the y-intersect ln(β0) and the gradient K, of the natural logarithm ln β of the reaction-resistance parameter β with respect to the reciprocal of the absolute temperature T of the battery cell 20a as β map information, which is part of the information VTI.

Specifically, the β calculator 35a refers to the β map information using the value of the absolute temperature T based on the cell temperature Ts measured by the temperature sensor 22. Then, the β calculator 35a extracts, from the β map information, a value of the natural logarithm ln β of the reaction-resistance parameter β matching with the reciprocal of the value of the absolute temperature T. The β calculator 35a takes exponential of the extracted value of the natural logarithm ln β of the reaction-resistance parameter β, thus obtaining a value of the reaction-resistance parameter β. The potential difference calculator 35b calculates a value of the potential difference ΔV across the reaction resistance Rr in accordance with the equation [eq8] using the value of the reaction-resistance parameter β input thereto from the β calculator 35a and the measured current Is input thereto from the current sensor 23.

Figure 7:
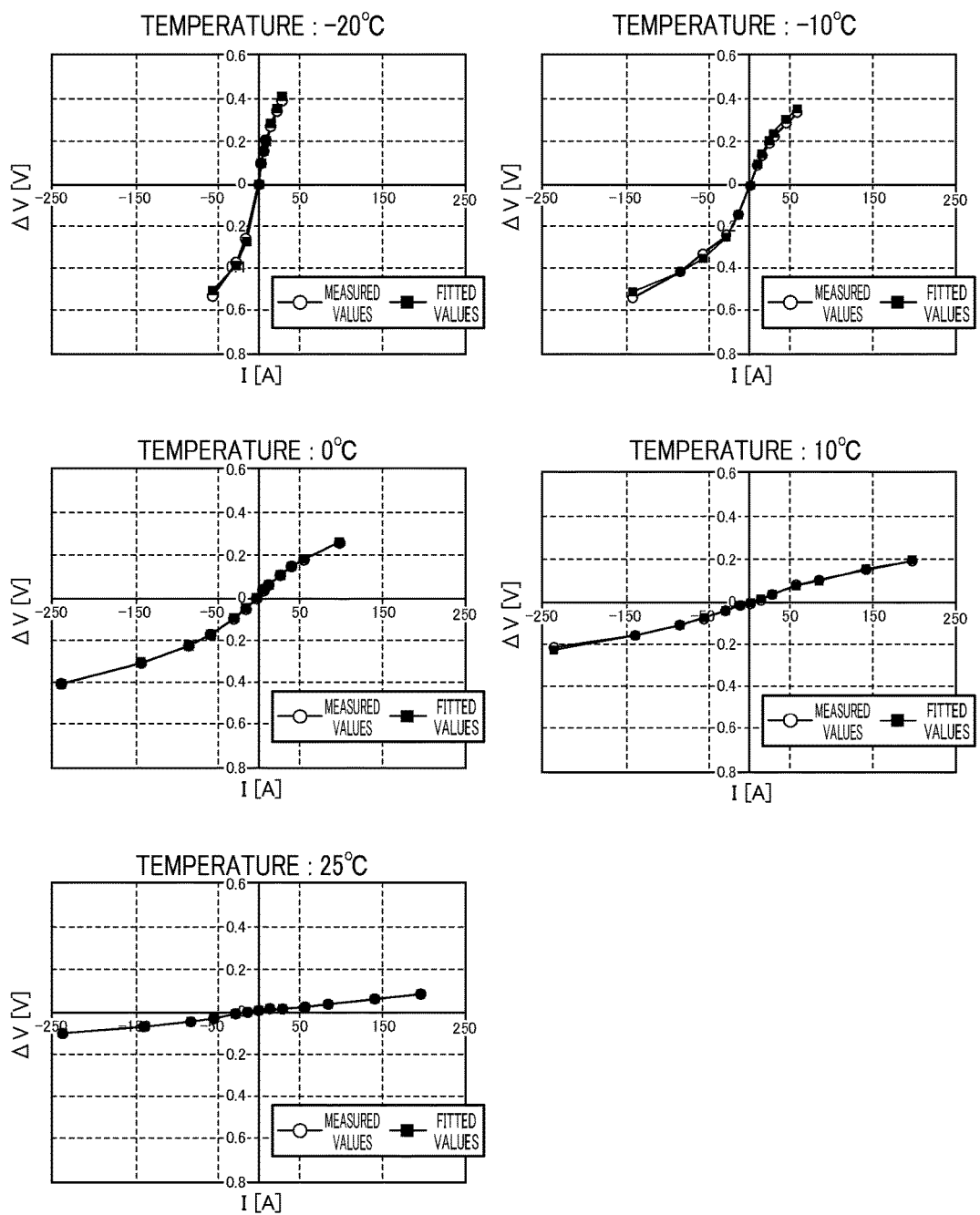
FIG. 7 is the set of graphs schematically illustrating how a current-voltage characteristic curve changes with change of the temperature of the battery cell according to the embodiment.

FIG. 7 schematically illustrates (1) First plotted data sets each including actually measured values of the potential difference ΔV across the reaction resistance Rr while the current I changes at a corresponding one of 25° C., 10° C., 0° C., –10° C., and –20° C. of the cell temperature Ts of the battery cell 20a (2) First curves each fitting a corresponding one of the first plotted data sets at a corresponding one of 25° C., 10° C., 0° C., –10° C., and –20° C. of the cell temperature Ts of the battery cell 20a (3) Second plotted data sets each including calculated values of the potential difference ΔV across the reaction resistance Rr while the current I changes at a corresponding one of 25° C., 10° C., 0° C., –10° C., and –20° C. of the cell temperature Ts of the battery cell 20a.

(4) Second curves each fitting a corresponding one of the second plotted data sets at a corresponding one of 25° C., 10° C., 0° C., –10° C., and –20° C. of the cell temperature Ts of the battery cell 20a.

FIG. 7 shows that (1) The actually measured potential difference ΔV across the reaction resistance Rr nonlinearly changes with change of the current I particularly when the cell temperature Ts of the battery cell 20a lies within a low-temperature region, for example, a temperature region below 0 degrees (2) The calculated potential difference ΔV across the reaction resistance Rr in accordance with the equation [eq8] changes with change of the current I in the same manner as the actually measured potential difference ΔV across the reaction resistance Rr.

That is, FIG. 7 shows that the calculated potential difference ΔV across the reaction resistance Rr in accordance with the equation [eq8] nonlinearly changes with change of the current I even if the cell temperature Ts of the battery cell 20a lies within the low-temperature region, which is, for example, below 0 degrees, in the same manner as the actually measured potential difference ΔV across the reaction resistance Rr.

Note that, although the potential difference ΔV across the reaction resistance Rr calculated based on the equation [eq8] nonlinearly changes, the potential difference ΔV seems to linearly change if the cell temperature Ts of the battery cell 20a is a high value of, for example, 25° C. (see FIG. 7). This is because, for example, the reaction-resistance parameter β changes exponentially if the cell temperature Ts of the battery cell 20a is a high value of 25° C., and the exponential change of the reaction-resistance parameter β results in the potential difference ΔV across the reaction resistance Rr calculated based on the equation [eq8] seems to linearly change within a limited range of the current I.

The ΔV calculator 35 therefore makes it possible to calculate, based on the reaction-resistance parameter β, the potential difference ΔV across the reaction resistance Rr with a higher accuracy even if the cell temperature Ts of the battery cell 20a lies within the low-temperature region, for example, the temperature region below 0 degrees. The potential difference ΔV across the reaction resistance Rr will also be referred to as a reaction-resistance potential difference ΔV hereinafter.

Figure 8:
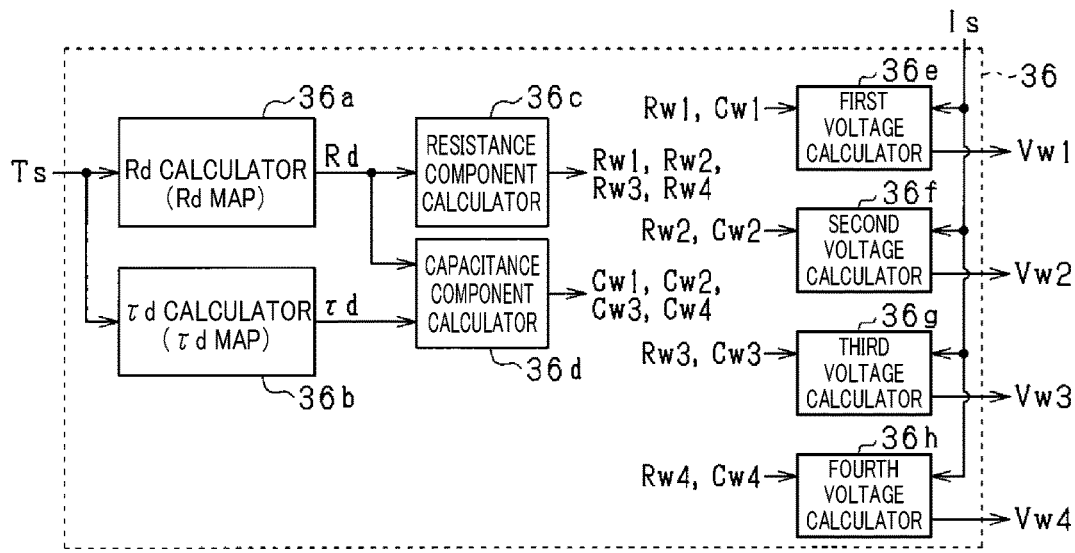
FIG. 8 is a schematic block diagram illustrating a polarization voltage calculator of the cell calculator.

The following describes how the polarization voltage calculator 36 works using FIG. 8.

The polarization voltage calculator 36 according to the embodiment calculates parameters correlating with the diffusion resistance of the battery cell 20a to calculate the first, second, third, and fourth polarization voltages Vw1, Vw2, Vw3, and Vw4 set forth above accordingly.

Let us describe the parameters correlating with the diffusion resistance of the battery cell 20a first, and describe how the polarization voltage calculator 36 calculates the first to fourth polarization voltages Vw1 to Vw4 next.

First, we derive Warburg impedance Z correlating with the diffusion resistance based on the diffusion equation in electrochemistry. Specifically, the following equation [eq9] shows the Warburg impedance Z:

$$Z = \frac{\Delta V}{\Delta I} = \frac{\frac{RT}{nF} \cdot \frac{\Delta C|_{x=0}}{C_o}}{-nFD \frac{\partial \Delta C}{\partial x}\bigg|_{x=0}} \qquad [\text{eq 9}]$$

In the equation [eq9], ΔV represents an electromotive force, and ΔI represents a current flowing through the battery cell 20a based on the electromotive force ΔV. The numerator ΔV can be obtained based on the following arrangement of the Nernst equation showing that the electromotive force ΔV is proportional to the natural logarithm of the concentration on a reacting interface of each of the active materials with respect to the electrolyte:

$$\Delta V = \frac{RT}{nF} \ln \frac{C_{x=0}}{C_0} = \frac{RT}{nF} \ln \frac{C_0 + \Delta C_{x=0}}{C_0} = \frac{RT}{nF} \ln\left(1 + \frac{C_{x=0}}{C_0}\right) \approx \frac{RT}{nF} \frac{\Delta C_{x=0}}{C_0}$$

In the numerator of the equation [eq9], Co represents an average concentration, i.e. an average lithium concentration, in each of active materials of the respective positive and negative electrodes, i.e. the concentration, i.e. lithium concentration, at a position in each of the active materials; the position has a sufficient distance from the reacting interface of the corresponding active material. In the numerator of the equation [eq9], $\Delta C$ represents the difference, in each of the active materials, between the lithium concentration at the position x and the average lithium concentration Co of the corresponding active material, and x represents the position, i.e. minimum distance, relative to the reacting interface of each of the active materials. In the numerator of the equation [eq9], $\Delta C|_{x=0}$ represents the difference, in each of the active materials, between the lithium concentration on the reacting interface and the average lithium concentration Co of the corresponding active material.

In the equation [eq9] in accordance with Fick's first law, the denominator shows that the current $\Delta I$ based on the amount of ions passing through unit area of each of the active materials per unit time is proportional to the lithium concentration gradient $$\left.\frac{\partial \Delta C}{\partial x}\right|_{x=0}.$$

The lithium concentration gradient $$\left.\frac{\partial \Delta C}{\partial x}\right|_{x=0}$$

represents the partial differential of the lithium concentration change $\Delta C$ on the reacting interface relative to the very small change $\partial x$ of the position x from its zero in each of the active materials. In the denominator of the equation [eq9], D represents a diffusion coefficient.

Arranging the equation [eq9] derives the following equation [eq10]:

$$Z = \frac{RT}{n^2 F^2 DCo} \cdot \frac{\Delta C|_{x=0}}{-\left.\frac{\partial \Delta C}{\partial x}\right|_{x=0}} \quad \text{[eq 10]}$$

Let us assume that, if an $\Delta C$ voltage is applied as the electromotive force $\Delta V$ to an electrode of the battery cell 20a, a sinusoidal change of the AC voltage results in a sinusoidal change of the concentration of ions in the electrolyte. This assumption allows the electromotive force $\Delta V$ and the concentration change $\Delta C$ to be expressed as the following respective equations [eq11A] and [eq11B] using an imaginary number j and an angular velocity $\omega$ of the sinusoidal AC voltage:

$$\Delta V = |\Delta V|\exp(j\omega t) \quad \text{[eq 11A]}$$

$$\Delta C = |\Delta C|\exp(j\omega t) \quad \text{[eq 11B]}$$

Where $|\Delta V|$ represents the complex amplitude of the electromotive force $\Delta V$, i.e. the sinusoidal AC voltage, and $|\Delta C|$ represents the complex amplitude of the sinusoidal concentration change $\Delta C$.

The following equation [eq12] represents Fick's second law:

$$\frac{\partial \Delta C}{\partial t} = \frac{\partial^2 \Delta C}{\partial x^2} \quad \text{[eq 12]}$$

The left-hand side of the equation [eq12] represents a value obtained by differentiating the concentration change $\Delta C$ represented in the equation [eq11] with respect to time t, so that the left-hand side of the equation [eq12] is expressed as $j\omega\Delta C$. This enables the general solution of the equation [eq12] to be expressed as the following equation [eq13] using predetermined constant values k1 and k2:

$$\Delta C = k1 \cdot \exp\left(\sqrt{\frac{j\omega}{D}} x\right) + k2 \cdot \exp\left(-\sqrt{\frac{j\omega}{D}} x\right) \quad \text{[eq 13]}$$

Now let us define reference character L representing the diffusion length of each active material relative to the reacting interface of the corresponding active material. Imposing the additional condition that the concentration change $\Delta C$ of ions becomes zero at the distance of x relative to the surface of the target electrode matching with the diffusion length L of the corresponding ions upon the equation [eq13] enables the equation [eq13] to be arranged as the following equation [eq14A]:

$$0 = k1 \cdot \exp\left(\sqrt{\frac{j\omega}{D}} L\right) + k2 \cdot \exp\left(-\sqrt{\frac{j\omega}{D}} L\right) \quad \text{[eq 14A]}$$

Arranging the equation [eq14A] derives the following equation [eq14B]:

$$k2 = -k1 \cdot \exp\left(\sqrt{\frac{j\omega}{D}} 2L\right) \quad \text{[eq 14B]}$$

Substituting the equation [eq14B] into the equation [eq13] derives the following equation [eq15]:

$$\begin{aligned}\Delta C &= k1 \cdot \exp\left(\sqrt{\frac{j\omega}{D}} x\right) - k1 \cdot \exp\left(\sqrt{\frac{j\omega}{D}} 2L\right) \cdot \exp\left(-\sqrt{\frac{j\omega}{D}} x\right) \\ &= k1 \cdot \exp\left(\sqrt{\frac{j\omega}{D}} L\right)\left\{\exp\left(\sqrt{\frac{j\omega}{D}} (x-L)\right) - \exp\left(-\sqrt{\frac{j\omega}{D}} (x-L)\right)\right\} \\ &= k1 \cdot \exp\left(\sqrt{\frac{j\omega}{D}} L\right) \cdot \sinh\left(\sqrt{\frac{j\omega}{D}} (x-L)\right) \\ &= k \cdot \exp\left(\sqrt{\frac{j\omega}{D}} L\right) \cdot \sinh\left(\sqrt{\frac{j\omega}{D}} (x-L)\right)\end{aligned} \quad \text{[eq 15]}$$

Differentiating partially the equation [eq15] with respect to x derives the following equation [eq16]:

$$\frac{\partial \Delta C}{\partial x} = \sqrt{\frac{j\omega}{D}} \cdot k \cdot \exp\left(\sqrt{\frac{j\omega}{D}} L\right) \cdot \cosh\left(\sqrt{\frac{j\omega}{D}} (x-L)\right) \quad \text{[eq 16]}$$

Substituting the equations [eq15] and [eq16] into the equation [eq10] enables a part of the equation [eq10] to be expressed as the following equation [eq17]:

$$\frac{\Delta C|_{x=0}}{-\frac{\partial \Delta C}{\partial x}\Big|_{x=0}} = \frac{k \cdot \sinh\left(-\sqrt{\frac{j\omega}{D}}L\right)}{-\sqrt{\frac{j\omega}{D}} \cdot k \cdot \cosh\left(-\sqrt{\frac{j\omega}{D}}L\right)} = \sqrt{\frac{D}{j\omega}} \cdot \tanh\left(\sqrt{\frac{j\omega}{D}}L\right) \quad [\text{eq 17}]$$

This enables the Warburg impedance Z described in the equation [eq10] to be expressed as the following equation [eq18] using a Laplace operator s equal to j×ω:

$$Z = \frac{RT}{n^2 F^2 DCo} \cdot \sqrt{\frac{D}{j\omega}} \tanh\left(\sqrt{\frac{j\omega}{D}}L\right) = \frac{RT}{n^2 F^2 DCo} \cdot \frac{1}{\sqrt{\frac{L^2}{D}s}} \tanh\left(\sqrt{\frac{L^2}{D}s}\right) = \frac{Rd}{\sqrt{\tau d \cdot s}} \tanh(\sqrt{\tau d \cdot s}) \quad [\text{eq 18}]$$

Where $$Rd = \frac{RT}{n^2 F^2 DCo},$$

and $$\tau d = \frac{L^2}{D}.$$

The embodiment refers to the variable Rd as a first parameter, and refers to the variable τd as a second parameter.

Now the diffusion coefficient D can be expressed as the following equation [eq19]:

$$D = Do \cdot \exp\left(-\frac{E}{RT}\right) \quad [\text{eq 19}]$$

Where Do represents a constant value independent of the absolute temperature T of the battery cell 20a and E represents activation energy required for reactions in the battery cell 20a. Using the equation [eq19] enables the first and second parameters Rd and τd to be expressed as the following respective equations [eq20A] and [eq20B]:

$$Rd = \frac{RTL}{n^2 F^2 Co} \cdot \frac{1}{Do} \exp\left(\frac{E}{RT}\right) \quad [\text{eq 20A}]$$

$$\tau d = \frac{L^2}{Do} \exp\left(\frac{E}{RT}\right) \quad [\text{eq 20B}]$$

These equations eq20A and eq20B show that the first and second parameters Rd and τd depend on the absolute temperature T of the battery cell 20a.

Taking the natural logarithm of both side3s of each of the equations [eq20A] and [eq20B] derives the following equations [eq21A] and [eq21B]:

$$\ln(Rd) = \frac{E}{R} \cdot \frac{1}{T} + \ln\left(\frac{RTL}{n^2 F^2 Co} \cdot \frac{1}{Do}\right) \quad [\text{eq 21A}]$$

$$\ln(\tau d) = \frac{E}{R} \cdot \frac{1}{T} + \ln\left(\frac{L^2}{Do}\right) \quad [\text{eq 21B}]$$

Each of the equations [eq21A] and [21B] has the same form as the following equation [eq21C] as a linear function:

$$Y = A1X + B1 \quad [\text{eq 21C}]$$

Where A1 is E/R and B1 is $$\ln\left(\frac{RTL}{n^2 F^2 Co} \cdot \frac{1}{Do}\right)$$

in the equation [eq21A], and A1 is E/R and B1 is $$\ln\left(\frac{L^2}{Do}\right)$$

in the equation [eq21B].

The parameters R, L, n, F, Co, and Do in the equation [eq21A] are previously determined. This enables measured values of the natural logarithm ln(Rd) of the first parameter Rd versus corresponding values of the reciprocal of the absolute temperature T of the battery cell 20a to be plotted in the graph having ln(Rd) as its Y axis and 1/T as its X axis in accordance with the Arrhenius plot. The embodiment obtains a linear function that is fit to the plotted values of the natural logarithm ln(Rd) of the first parameter Rd with respect to the reciprocal of the absolute temperature T of the battery cell 20a. This enables a value of $$\ln\left(\frac{RTL}{n^2 F^2 Co} \cdot \frac{1}{Do}\right)$$

to be obtained as the y-intersect of the linear function, and a value of E/R to be obtained as the gradient of the linear function.

Similarly, the parameters R, L, and Do in the equation [eq21B] are previously determined. This enables measured values of the natural logarithm ln(τd) of the first parameter τd versus corresponding values of the reciprocal of the absolute temperature T of the battery cell 20a to be plotted in the graph having ln(τd) as its Y axis and E/R as its X axis in accordance with the Arrhenius plot. The embodiment obtains a linear function that is fit to the plotted values of the natural logarithm ln(τd) with respect to the reciprocal of the absolute temperature T of the battery cell 20a. This enables a value of $$\ln\left(\frac{L^2}{Do}\right)$$

to be obtained as the y-intersect of the linear function, and a value of E/R to be obtained as the gradient of the linear function.

For example, the storage 31 stores the obtained linear function of the natural logarithm ln(Rd) of the first parameter Rd with respect to the reciprocal of the absolute temperature T of the battery cell 20a as Rd map information, which is part of the information VTI. Similarly, the storage 31 stores the obtained linear function of the natural logarithm ln(τd) of the second parameter τd with respect to the reciprocal of the absolute temperature T of the battery cell 20a as τd map information, which is part of the information VTI.

Specifically, the Rd calculator 36a refers to the Rd map information using the value of the absolute temperature T based on the cell temperature Ts measured by the temperature sensor 22. Then, the Rd calculator 36a extracts, from the Rd map information, a value of the natural logarithm ln(Rd) of the first parameter Rd matching with the reciprocal of the value of the absolute temperature T. The Rd calculator 36a takes exponential of the extracted value of the natural logarithm ln(Rd), thus obtaining a value of the first parameter Rd based.

Similarly, the Rd calculator 36b refers to the Rd map information using the value of the absolute temperature T based on the cell temperature Ts measured by the temperature sensor 22. Then, the Rd calculator 36b extracts, from the Rd map information, a value of the natural logarithm ln(τd) of the second parameter τd matching with the reciprocal of the value of the absolute temperature T. The Rd calculator 36b takes exponential of the extracted value of the natural logarithm ln(τd), thus obtaining a value of the second parameter τd.

The resistance component calculator 36c calculates, based on the first parameter Rd, the first to fourth resistance components Rw1 to Rw4 in accordance with the following equation [eq22]:

$$Rwm = \frac{8 \cdot Rd}{(2m-1)^2 \pi^2} \quad [\text{eq 22}]$$

Where m represents positive integers of 1, 2, 3, and 4 according to the embodiment. The first to fourth resistance components Rw1 to Rw4 constitute, for example, the diffusion resistance of the battery cell 20a.

The capacitance calculator 36d calculates, based on the first and second parameters Rd and τd, the first to fourth capacitance components Cw1 to Cw4 in accordance with the following equation [eq23]:

$$Cwm = \frac{\tau d}{2 \cdot Rd} \quad [\text{eq 23}]$$

Calculating the inverse Laplace transform Z(t) of the Warburg impedance Z, which is expressed in the equation [eq18] in the complex domain, results in the following equation [eq22]:

$$Z(t) = \sum_{m=1}^{4} \left( \frac{2 \frac{Rd}{\sqrt{\tau d}}}{Rd} \cdot \exp\left( -\frac{(2m-1)^2 \pi^2 \left(\frac{Rd}{\sqrt{\tau d}}\right)^2}{4Rd^2} \right) \right) \quad [\text{eq 22}]$$

$$= \frac{1}{Cw1} \cdot \exp\left(-\frac{t}{Rw1Cw1}\right) + \frac{1}{Cw2} \cdot \exp\left(-\frac{t}{Rw2Cw2}\right) + \frac{1}{Cw3} \cdot \exp\left(-\frac{t}{Rw3Cw3}\right) + \frac{1}{Cw4} \cdot \exp\left(-\frac{t}{Rw4Cw4}\right)$$

Where:

$$Rwm = \frac{8 \cdot Rd}{(2m-1)^2 \pi^2} \quad [\text{eq 22A}]$$

$$Cwm = \frac{\tau d}{2 \cdot Rd} \quad [\text{eq 22B}]$$

Calculating the Laplace transform of the equation [eq22] obtains the following equation [eq23]:

$$Z = \frac{Rw1}{1+s \cdot Rw1Cw1} + \frac{Rw2}{1+s \cdot Rw2Cw2} + \frac{Rw3}{1+s \cdot Rw3Cw3} + \frac{Rw4}{1+s \cdot Rw4Cw4} \quad [\text{eq 23}]$$

The equation [eq23] shows that the four RC parallel circuits 45d1, 45d2, 45d3, and 45d4 of the diffusion impedance model 45d illustrated in FIG. 3 equivalently represent the Warburg impedance Z. In other words, the inventors of the present application have found out the relationships between the Warburg impedance Z and the impedance components Rw1, Rw2, Rw3, Rw4, Cw1, Cw2, Cw3, and Cw4 of the diffusion impedance model 45d illustrated in FIG. 3 in accordance with documents and other technical literatures. For example, E. Kuhn et al, *Modelling Ni-mH battery using Cauer and Foster structures*, JOURNAL of Power Sources 158, 2006.

The first voltage calculator 36e, which serves as, for example, a first polarization voltage calculator, performs a calculation routine to calculate, based on the first resistance and capacitance components Rw1 and Cw1, the first polarization voltage Vw1. For example, the first voltage calculator 36e of the embodiment performs a calculation routine to calculate a value of the first polarization voltage Vw1 in accordance with a discretization equation every task period; the discretization equation is obtained by discretizing the transfer function of the RC parallel circuit 45d1. In particular, the first voltage calculator 36e calculates a value Vw1 (t) of the first polarization voltage Vw1 in accordance with the following discretization equation [eq24] at a current calculation routine t:

$$Vw1(t) = -a1 \cdot Vw1(t-1) + b1 \cdot Is(t) + b1 \cdot Is(t-1) \quad [\text{eq 24}]$$

Where:
(1) Vw1 (t−1) represents a value of the first polarization voltage Vw1 calculated at the previous calculation routine (t−1)
(2) Is(t) represents a value of the current measured by the current sensor 22 at the current calculation routine t
(3) Is(t−1) represents a value of the current measured by the current sensor 22 at the previous calculation routine (t−1)
(4) a1 represents a parameter expressed as the following equation [eq24A]
(5) b1 represents a parameter expressed as the following equation [eq24B].

$$a1 = \frac{\Delta T - 2 \cdot Rw1 \cdot Cw1}{\Delta T + 2 \cdot Rw1 \cdot Cw1} \quad [\text{eq 24A}]$$

$$b1 = \frac{\Delta T \cdot Rw1}{\Delta T + 2 \cdot Rw1 \cdot Cw1} \quad [\text{eq 24B}]$$

In the equations [eq24A] and [eq24B], ΔT represents the length of each task period.

The second voltage calculator 36f, which serves as, for example, a first polarization voltage calculator, calculates, based on the second resistance and capacitance components Rw2 and Cw2, the second polarization voltage Vw2 in the same manner as the first voltage calculator 36e. The third voltage calculator 36g, which serves as, for example, a first polarization voltage calculator, calculates, based on the third resistance and capacitance components Rw3 and Cw3, the third polarization voltage Vw3 in the same manner as the first voltage calculator 36e. The fourth voltage calculator 36h, which serves as, for example, a first polarization voltage calculator, calculates, based on the fourth resistance and capacitance components Rw4 and Cw4, the fourth polarization voltage Vw4 in the same manner as the first voltage calculator 36e.

Referring to FIG. 2, the first adder 38 calculates the sum of the first to fourth polarization voltages Vw1 to Vw4 as a total polarization voltage Vw0. The second adder 39 calculates the sum of the calculated value of the DC-resistance potential difference Vs, the calculated value of the reaction-resistance potential difference ΔV, and the total polarization voltage Vw0. The OCV calculator 40 subtracts the output value of the second adder 39, which is the sum of the values Vs, ΔV, and Vw0, from the terminal voltage CCV across the battery cell 20a measured by the voltage sensor 21. This subtraction calculates the open circuit voltage OCV across the battery cell 20a.

The SOC converter 37 calculates a state of charge (SOC) of the battery cell 20a based on the open circuit voltage OCV across the battery cell 20a. For example, the storage 31 stores SOC map information as part of the information VTI. The SOC map information represents the correlations between the open circuit voltage OCV and the SOC of the battery cell 20a. For example, experiments using the actual battery cell 20a enable the SOC map information to be measured, so that the measured SOC map information is stored in the storage 31.

For example, the SOC converter 37 refers to the SOC map information using the value of the open circuit voltage OCV calculated by the OCV calculator 40, thus extracting a value of the SOC of the battery cell 20a matching with the calculated value of the open circuit voltage OCV.

Figure 9A:
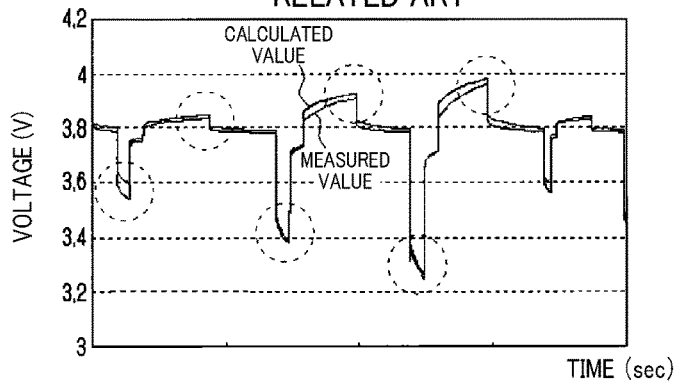
FIG. 9A is a graph schematically illustrating how a calculated terminal voltage and an actually measured terminal voltage across a single RC circuit model of an battery cell according to a related art change over time.
Figure 9B:
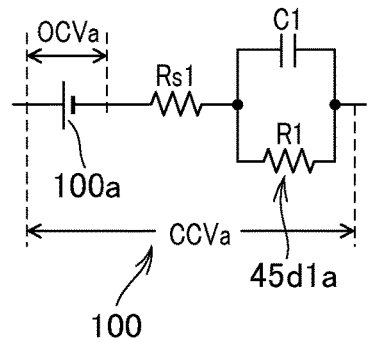
FIG. 9B is a circuit diagram schematically illustrating an example of the configuration of the single RC model of the battery cell according to the related art.
Figure 10:
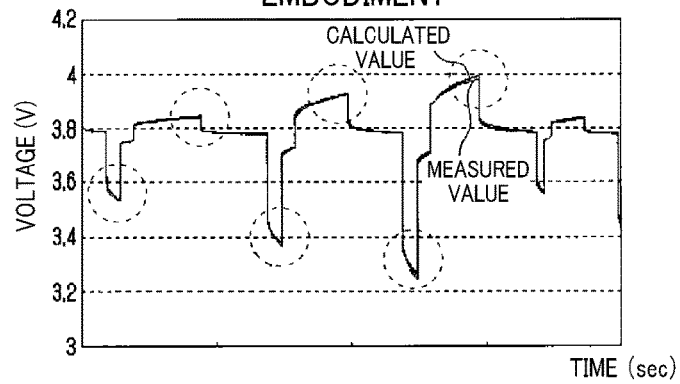
FIG. 10 is a graph schematically illustrating how a calculated terminal voltage and an actually measured terminal voltage across the equivalent circuit model illustrated in FIG. 3 according to the embodiment change over time.

Next, the following describes, with reference to FIGS. 9A, 9B, and 10, a result of the comparison in calculation accuracy, between (1) The terminal voltage CCV of the battery cell 20a calculated based on the equivalent circuit model 45 according to the embodiment (2) The terminal voltage CCV of the battery cell 20a calculated based on a single RC circuit model 100 according to a related art.

Note that, as illustrated in FIG. 9B, the single RC circuit model 100 consists of a power source 100a having a terminal voltage matching with an open circuit voltage (OCVa) across the battery cell 20a, a single resistor Rs1, and a single RC parallel circuit 45d1a connected in series thereto. The single RC parallel circuit 45d1a consists of a single resistance R1 and a capacitance C1 connected in parallel thereto.

FIG. 9A illustrates the results of a first test representing that (1) How a calculated value of a terminal voltage CCVa across the single RC circuit model 100 of any battery cell 20a according to the related art changes over time (2) How an actually measured value of the terminal voltage CCVa across the single RC circuit model 100 of the battery cell 20a according to the related art changes over time.

In contrast, FIG. 10 illustrates the results of a second test representing that (1) How the calculated value of the terminal voltage CCV across the equivalent circuit model 45 of the battery cell 20a according to the embodiment changes over time (2) How an actually measured value of the terminal voltage CCV across the equivalent circuit model 45 of the battery cell 20a according to the embodiment changes over time.

Note that, in the embodiment, adding the open circuit voltage OCV, which is calculated based on the state of charge SOC calculated by the SOC converter 37, to the output of the second adder 39 obtains the CCV across the equivalent circuit model 45. In addition, note that the first and second tests were carried out at a low temperature, i.e. −15° C., of the cell temperature Ts of the battery cell 20a; the battery cell 20a has current-voltage characteristics that nonlinearly change in a low-temperature region including the low temperature of −15° C.

FIG. 9A shows that the related art results in considerable gaps between some calculated values and the corresponding measured values of the terminal voltage CCVa.

In contrast, FIG. 10 shows that the embodiment results in more reduced gaps between the calculated values and the corresponding measured values of the terminal voltage CCV. This is because the equivalent circuit model 45, which includes the diffusion impedance model 45d comprised of the series of the four RC parallel circuits 45d1 to 45d4, shows the current-voltage characteristics of the battery cell 20a including nonlinear characteristics with a higher accuracy as compared to the single RC circuit model 100.

Accordingly, the equivalent circuit model 45 including the diffusion impedance model 45d enables the accuracy of predicting the allowable input power to the battery pack 20 and allowable output power from the battery pack 20 to be improved.

Next, the following describes the power prediction task for predicting the allowable input power Win to the battery pack 20 and allowable output power Wout from the battery pack 20, which is carried out by the power predictor 33, with reference to FIGS. 11 to 16.

First, the following describes a Wout prediction task, which is included in the power prediction task, for predicting the allowable output power Wout. The Wout prediction task aims to predict maximum power continuously outputtable by the battery pack 20 over a predetermined discharge duration Tdff from a specified prediction time, for example, the present time.

The embodiment sets the discharge duration Tdff to, for example, 10 seconds. For example, the Wout prediction task aims to determine whether the battery pack 20 has output performance sufficient to supply power to the motor-generator of the vehicle under acceleration of the vehicle if the battery system 10 is installed in a vehicle equipped with the motor-generator serving as the main engine of the vehicle. As another example, the Wout prediction task also aims to determine whether the battery pack 20 has output performance sufficient to supply power to a starter of an idle reduction system of a vehicle for restarting an internal combustion engine of the vehicle.

Figure 11:
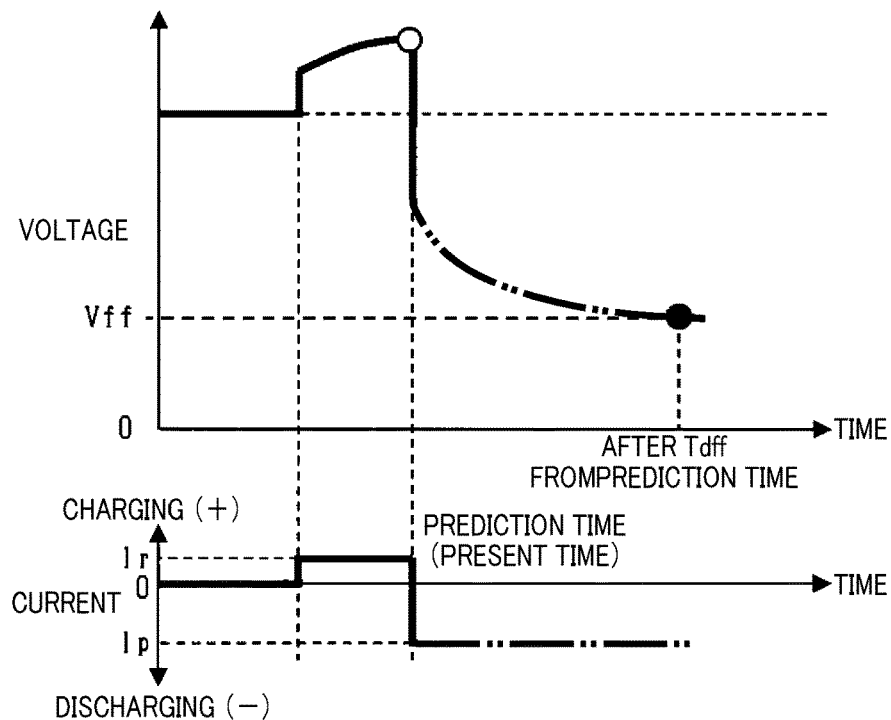
FIG. 11 is the set of a first graph schematically illustrating how the terminal voltage across each battery cell has changed over time and will have changed over time, and a second graph schematically illustrating how a current flowing through the corresponding battery cell has changed over time and will have changed over time.
Figure 12:
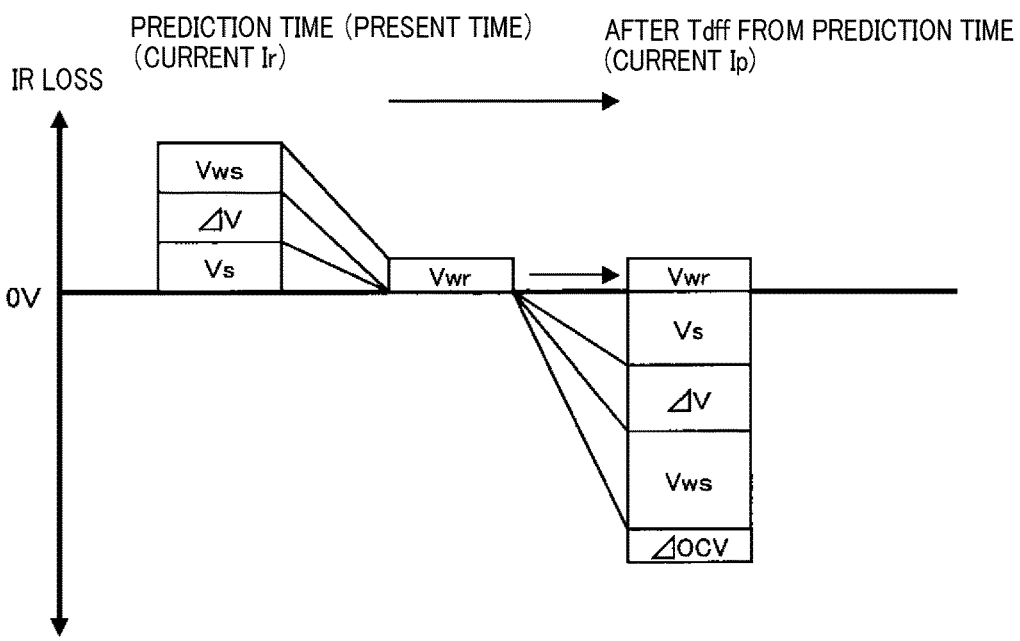
FIG. 12 is a graph schematically illustrating a value of IR loss representing the voltage drop across each battery cell at the specified prediction time and a future value of the IR loss at time after the lapse of a predetermined discharge duration from the specified prediction time.

The following describes a summary of the Wout prediction task according to the embodiment using FIGS. 11 and 12.

Referring to FIG. 11, the Wout prediction task predicts a terminal voltage Vff across each battery cell 20a at the timing when the discharge duration Tdff will have elapsed since a specified prediction time, for example, the present time, if a supposed value of a discharge current Ip is flowing through the corresponding battery cell 20a over the discharge duration Tdff. Note that, in FIG. 11, reference character Ir represents a current flowing through each battery cell at the specified prediction time.

The Wout prediction task is capable of predicting, as the allowable output power Wout, the product of the sum of the terminal voltages Vff of all the battery cells 20a and the supposed value of the discharge current Ip if the minimum value in the terminal voltages Vff of all the battery cells 20a is sufficiently close to a predetermined allowable lower limit voltage VLlimit for the battery cells 20a. The Wout prediction task predicts the terminal voltage Vff of each battery cell 20a using a total remaining voltage Vwr as illustrated in FIG. 12.

The total remaining voltage, i.e. the future total remaining voltage, Vwr represents the total of the remaining polarization voltages of all the battery cells 20a after the lapse of the discharge duration Tdff from the specified prediction time; the polarization voltage across each battery cell 20a at the specified prediction time decreases down to the corresponding remaining polarization voltage after the lapse of the discharge duration Tdff from the specified prediction time.

That is, if the m-th capacitance component Cwm constituting the diffusion impedance model 45d is charged at the specified prediction time (m=1, 2, 3, or 4), the effects of the polarization voltage Vwm across the m-th capacitance component Cwm at the specified prediction time still remain after the lapse of the discharge duration Tdff from the specified prediction time. Predicting the allowable output power Wout based on the total remaining voltage Vwr therefore enables the effects of the remaining quantity of charge stored in each of the capacitance components Cwm after the lapse of the discharge duration Tdff from the specified prediction time to be added to the predicted allowable output power Wout. This results in improvement of the accuracy of predicting the allowable output power Wout.

Figure 13:
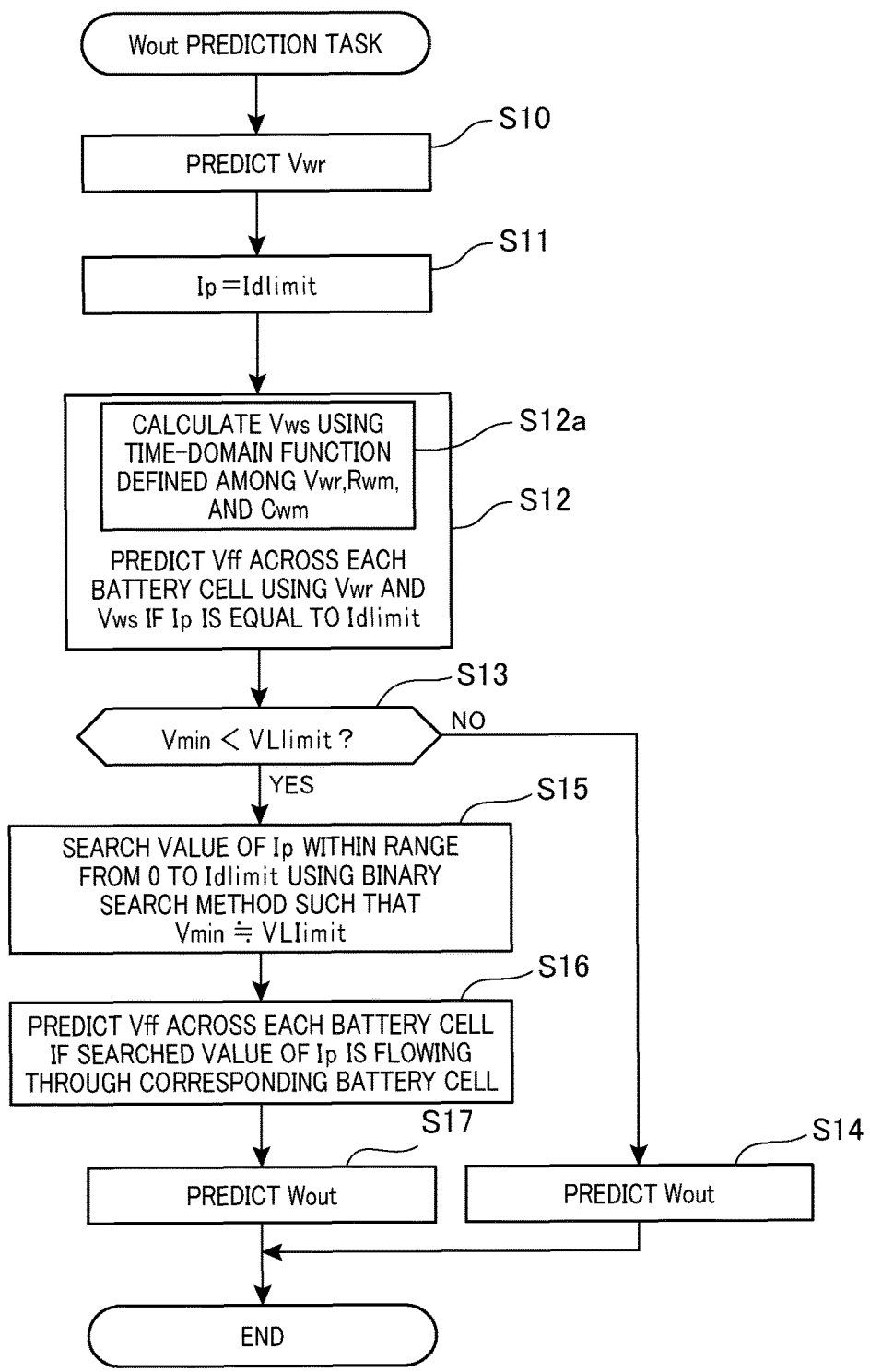
FIG. 13 is a flowchart schematically illustrating an example of the sequence of a Wout prediction task carried out by a CPU of a battery ECU illustrated in FIG. 1.

The following specifically describes how the CPU 30a, i.e. its power predictor 33, performs the Wout prediction task with reference to FIG. 13. As described above, the power predictor 33 repeatedly performs the Wout prediction task every task period.

When starting the Wout prediction task, the power predictor 33, which serves as, for example, a remaining voltage predictor, predicts a value of the total remaining voltage Vwr in accordance with the following continuous time-domain function, i.e. continuous time-domain equation, [eq25] in step S10:

$$Vwr = \sum_{m=1}^{4}\left[Vwm \cdot \exp\left(-\frac{Tdff}{Cwm \cdot Rwm}\right)\right] \quad [\text{eq 25}]$$

That is, the total remaining voltage Vwr represents the total of the remaining polarization voltages of all the battery cells 20a after the lapse of the discharge duration Tdff from a specified prediction time.

In the equation [eq25], a value of each of the first to fourth polarization voltages Vw1 to Vw4 is a value calculated by a corresponding one of the first to fourth voltage calculators 36e to 36h. Specifically, the power predictor 33 predicts a value of the remaining polarization voltage across each of the battery cells 20a after the lapse of the discharge duration Tdff from the specified prediction time in step S10. Thereafter, the power predictor 33 calculates the sum of the remaining polarization voltages of all the battery cells 20a, thus calculating a value of the total remaining voltage Vwr. The equation [eq25] shows that the total remaining voltage Vwr decreases over time.

Following the operation in step S10, the power predictor 33 sets the supposed value of the discharge current Ip for each battery cell 20a to its predetermined allowable upper limit in step S11. The allowable upper limit for the discharge current Ip from each battery cell 20a represents a negative value, and the absolute value of the allowable upper limit for the discharge current Ip from each battery cell 20a represents an allowable upper limit for the absolute value of the discharge current Ip from the corresponding battery cell 20a. The allowable upper limit for the discharge current Ip will also be referred to as an allowable discharge upper limit Idlimit.

Next, the power predictor 33 serves as, for example, a first discharge terminal-voltage calculator in step S12. Specifically, the power predictor 33 predicts, in accordance with the following equation [eq26], the terminal voltage Vff across each battery cell 20a at the timing when the discharge duration Tdff will have elapsed since the specified prediction time if the discharge current Ip having the allowable discharge upper limit Idlimit is flowing through the corresponding battery cell 20a over the discharge duration Tdff in step S12:

$$Vff = OCV + Vs + \Delta V + Vws \pm Vwr \pm \Delta OCV \quad [\text{eq 26}]$$

The equation [eq26] uses (1) As a value of the DC-resistance potential difference Vs, a value calculated by the Vs calculator 34 if the multiplier 34b of the Vs calculator 34 multiplies the value of the DC resistance Rs by the discharge current Ip in place of the current Is measured by the current sensor 22

(2) As a value of the potential difference ΔV across the reaction resistance Rr, a value calculated by the potential difference calculator 35b if the potential difference calculator 35b uses the discharge current Ip in place of the current Is measured by the current sensor 22

(3) As a value of the total remaining voltage Vwr, a value calculated in step S10.

In the equation [eq26], reference character Vws represents a future polarization voltage generated across the diffusion impedance model 45d at the timing when the discharge duration Tdff will have elapsed since the specified prediction time if no charges are stored in the capacitance components Cw1, Cw2, Cw3, and Cw4. For example, the power predictor 33, which serves as, for example, a second polarization voltage calculator in step S12a, calculates a value of the future polarization voltage Vws in accordance with the following continuous time-domain function, i.e. time-domain continuous equation, [eq27] before calculating the equation [eq26]:

$$Vws = \sum_{m=1}^{4}(Ip \times Rwm)\left\{1 - \exp\left(-\frac{Tdff}{Cwm \times Rwm}\right)\right\} \quad [\text{eq 27}]$$

The sum of the total remaining voltage Vwr calculated in accordance with the equation [eq25] and the future polarization voltage Vws calculated in accordance with the equation [eq27] shows a potential difference, i.e. a voltage, across the diffusion impedance model 45$d$ at the timing when the discharge duration Tdff will have elapsed since the specified prediction time.

Additionally, in the equation [eq26], reference character $\Delta$OCV represents the amount of change of the open circuit voltage OCV at the timing when the discharge duration Tdff will have elapsed since the specified prediction time if the discharge current Ip having the allowable discharge upper limit Idlimit is flowing through the corresponding battery cell 20$a$ over the discharge duration Mff.

For example, the power predictor 33 calculates the amount of change of the open circuit voltage OCV based on a value of the open circuit voltage OCV calculated by the OCV calculator 40 at the specified prediction time. More specifically, for example, the power predictor 33 integrates the discharge current Ip over the discharge duration Tdff to calculate the amount of change of the SOC of each battery cell 20$a$; the amount of change of the SOC of each battery cell 20$a$ is a negative value during the corresponding battery cell 20$a$ being discharged.

Then, the power predictor 33 calculates, as a predicted SOC, the sum of the amount of change of the SOC of each battery cell 20$a$ and the value of the SOC of the corresponding battery cell 20$a$ calculated by the SOC converter 37 at the specified prediction time. The power predictor 33 refers to the SOC map information using the value of the predicted SOC of each battery cell 20$a$, thus extracting, from the SOC map, a value of the open circuit voltage OCV of the corresponding battery cell 20$a$ matching with the value of the predicted SOC of the corresponding battery cell 20$a$. Thereafter, the power predictor 33 subtracts the value of the open circuit voltage OCV calculated by the OCV calculator 40 at the specified prediction time from the extracted value of the open circuit voltage OCV of each battery cell 20$a$. This calculates the amount of change $\Delta$OCV of the open circuit voltage OCV of each battery cell 20$a$.

Note that the percentage of the amount of change $\Delta$OCV of the open circuit voltage OCV of each battery cell 20$a$ to the terminal voltage Vff across the corresponding battery cell 20$a$ is a small value, because the discharge duration Tdff is set to ten seconds according to the embodiment. This therefore can eliminate the term of the amount of change $\Delta$OCV of the open circuit voltage OCV from the right-hand side of the equation [eq26].

Following the operation in step S12, the power predictor 33 selects a minimum value Vmin from the terminal voltages Vff across all the battery cells 20$a$ in step S13. Then, the power predictor 33 determines whether the selected minimum value Vmin is less than the allowable lower limit voltage VLlimit in step S13.

Figure 14:
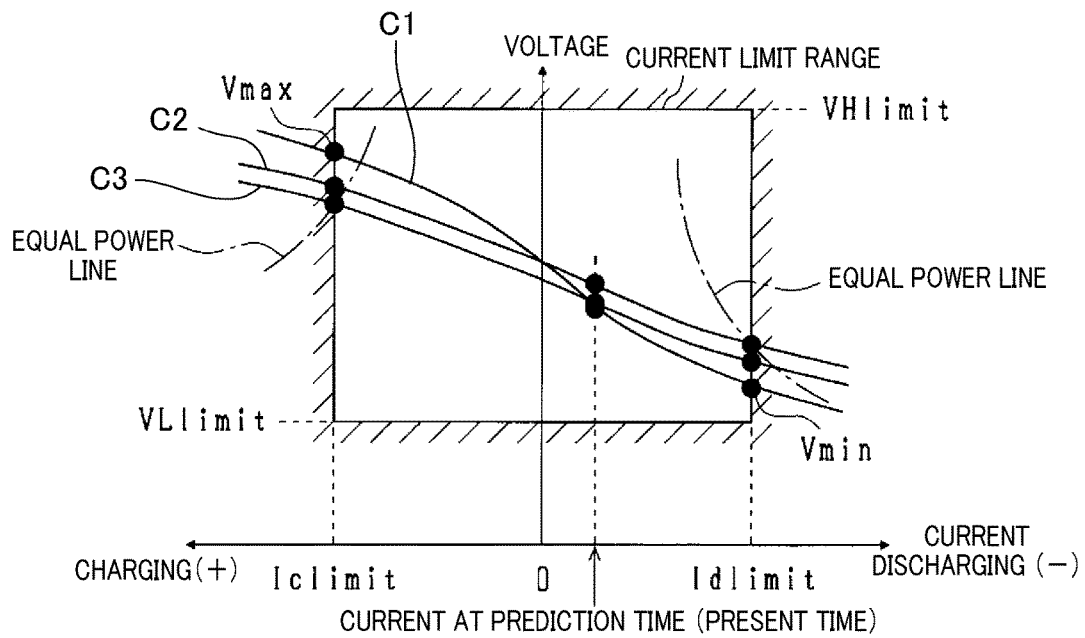
FIG. 14 is a graph schematically illustrating three current-voltage characteristic curves of corresponding three battery cells of the secondary battery in the situation where the determination in step S13 is negative.

FIG. 14 schematically illustrates an example of the situation where the determination in step S13 is negative. In FIG. 14, reference character VHlimit represents a predetermined allowable upper limit voltage for the battery cells 20$a$, and reference character Iclimit represents a predetermined allowable upper limit for a charge current to each battery cell 20$a$. The allowable upper limit Iclimit for the charge current will also be referred to as an allowable charge upper limit Idlimit.

Note that the range defined by the allowable lower limit voltage VLlimit and the allowable upper limit voltage VHlimit for each battery cell 20$a$ represents the voltage limit range for the corresponding battery cell 20$a$. Note that the range defined by the allowable discharge upper limit Idlimit and the allowable charge upper limit Iclimit for each battery cell 20$a$ represents the range of use of current for the corresponding battery cell 20$a$, in other words, the current limit range for the corresponding battery cell 20$a$.

For the sake of simplicity, FIG. 14 illustrates only three current-voltage characteristic curves C1, C2, and C3 for individually three battery cells 20$a$. More specifically, each of the characteristic curves C1 to C3 represents the relationship between the terminal voltage across the corresponding battery cell 20$a$ and each of the discharge current and the charge current flowing through the corresponding battery cell 20$a$. FIG. 14 schematically illustrates an operating point for each of the three battery cells 20$a$ on a corresponding one of the current-voltage characteristic curves C1 to C3.

FIG. 14 shows that the minimum value Vmin of the battery cell 20$a$ having the curve C1 is equal to or more than the allowable lower limit voltage VLlimit.

Upon determining that the selected minimum value Vmin is equal to or more than the allowable lower limit voltage VLlimit (NO in step S13), the power predictor 33 determines that the terminal voltages Vff across all the battery cells 20$a$ are equal to or more than the allowable lower limit voltage VLlimit in step S13.

Then, the power predictor 33, which serves as, for example, a first outputtable power predictor of a target power parameter predictor, calculates the total sum Vff($\Sigma$) of the terminal voltages Vff across all the battery cells 20$a$ predicted in step S12, and calculates the product of the total sum Vff($\Sigma$) and the supposed value, i.e. the allowable discharge upper limit Idlimit, of the discharge current Ip in step S14.

Consequently, the power predictor 33 predicts the calculated product of the total sum Vff($\Sigma$) and the allowable discharge upper limit Idlimit of the discharge current Ip as a value of the allowable output power Wout at the timing when the discharge duration Tdff will have elapsed since the specified prediction time in step S14.

Otherwise, upon determining that the selected minimum value Vmin is less than the allowable lower limit voltage VLlimit (YES in step S13), the sequence of the Wout prediction task proceeds to step S15.

In step S15, the power predictor 33, serves as, for example, a discharge current searcher. Specifically, in step S15, the power predictor 3 calculates, as an absolute maximum discharge current Idmax, an absolute value of the discharge current Ip; the absolute value of the discharge current Ip is required to cause the minimum value Vmin in the terminal voltages Vff at the timing when the discharge duration Tdff will have elapsed since the specified prediction time to be set to the allowable lower limit voltage VLlimit. The absolute maximum discharge current Idmax is calculated to be equal to or lower than the absolute discharge upper limit Idlimit.

For example, the power predictor 33 calculates the absolute maximum discharge current Idmax using one of known search methods in step S15. In particular, the power predictor 33 according to the embodiment calculates the absolute maximum discharge current Idmax using a known binary search method. That is, the absolute maximum discharge current Idmax represents an absolute maximum value of the discharge current Ip; the absolute maximum value of the discharge current Ip satisfies both the voltage and current limit ranges of each battery cell 20$a$.

Specifically, the power predictor 33 searches for a value of the discharge current Ip within the range from zero to the absolute value of the allowable discharge upper limit Idlimit using the known binary search method such that the interval between the minimum value Vmin and the allowable lower limit voltage VLlimit is sufficiently small, in other words, the minimum value Vmin is sufficiently close to the allowable lower limit voltage VLlimit in step S15. Then, the power predictor 33 determines the searched value of the discharge current Ip as the maximum discharge current Idmax, and sets the maximum discharge current Idmax as the supposed value of the discharge current Ip. That is, the supposed value Idmax is assumed to flow through each battery cell 20a over the discharge duration Tdff.

Figure 15:
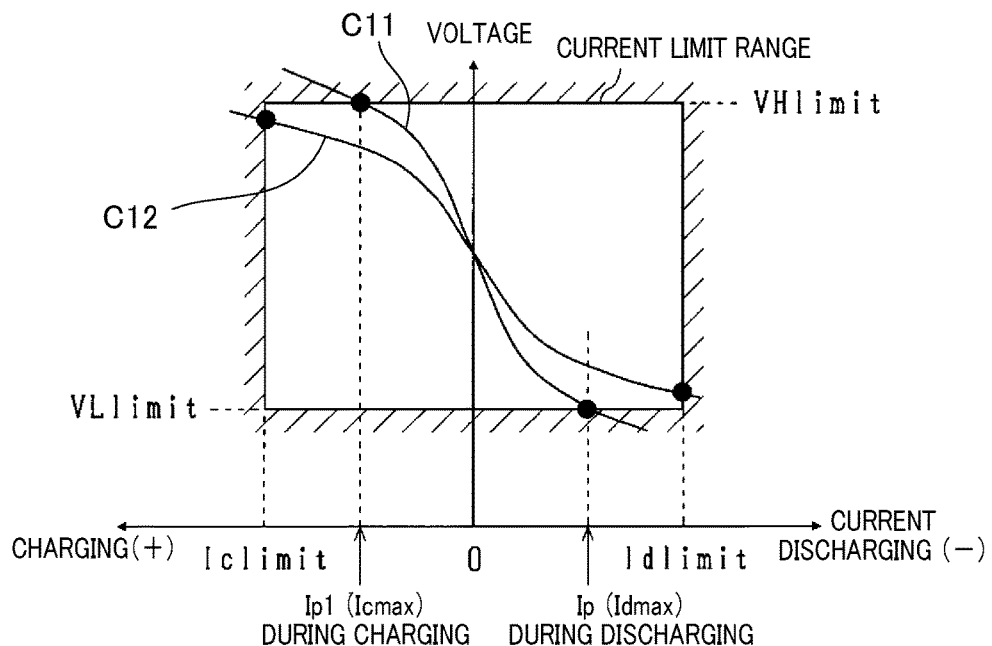
FIG. 15 is a graph schematically illustrating two current-voltage characteristic curves of corresponding two battery cells of the secondary battery in the situation where the determination in step S13 is affirmative.

For the sake of simplicity, FIG. 15 illustrates only two current-voltage characteristic curves C11 and C12 for individually two battery cells 20a if determination in step S13 is affirmative.

More specifically, each of the characteristic curves C11 and C12 represents the relationship between the terminal voltage across the corresponding battery cell 20a and each of the discharge current and the charge current flowing through the corresponding battery cell 20a. In addition, FIG. 15 schematically illustrates an operating point for each of the two battery cells 20a on a corresponding one of the current-voltage characteristic curves C11 and C12. FIG. 15 illustrates an example of the supposed value of the discharge current Ip set in step S15.

Following the operation in step S15, the power predictor 33 serves as, for example, a second discharge terminal-voltage predictor in step S16. Specifically, in step S16, the power predictor predicts the terminal voltage Vff across each battery cell 20a at the timing when the discharge duration Tdff will have elapsed since the specified prediction time if the supposed value, i.e. the maximum discharge current Idmax, of the discharge current Ip determined in step S15 is flowing through the corresponding battery cell 20a over the discharge duration Tdff.

Following the operation in step S16, the power predictor 33 serves as, for example, a second outputtable power predictor. Specifically, in step S17, the power predictor 33 calculates the total sum Vff(Σ) of the terminal voltages Vff across all the battery cells 20a predicted in step S16. In step S17, the power predictor 33 calculates the product of the total sum Vff(Σ) and the supposed value, i.e. the maximum discharge current Idmax, of the discharge current Ip, determined in step S15 in step S17. Consequently, the power predictor 33 predicts the calculated product of the total sum Vff(Σ) and the maximum discharge current Idmax of the discharge current Ip as a value of the allowable output power Wout at the timing when the discharge duration Tdff will have elapsed since the specified prediction time in step S17.

Figure 16:
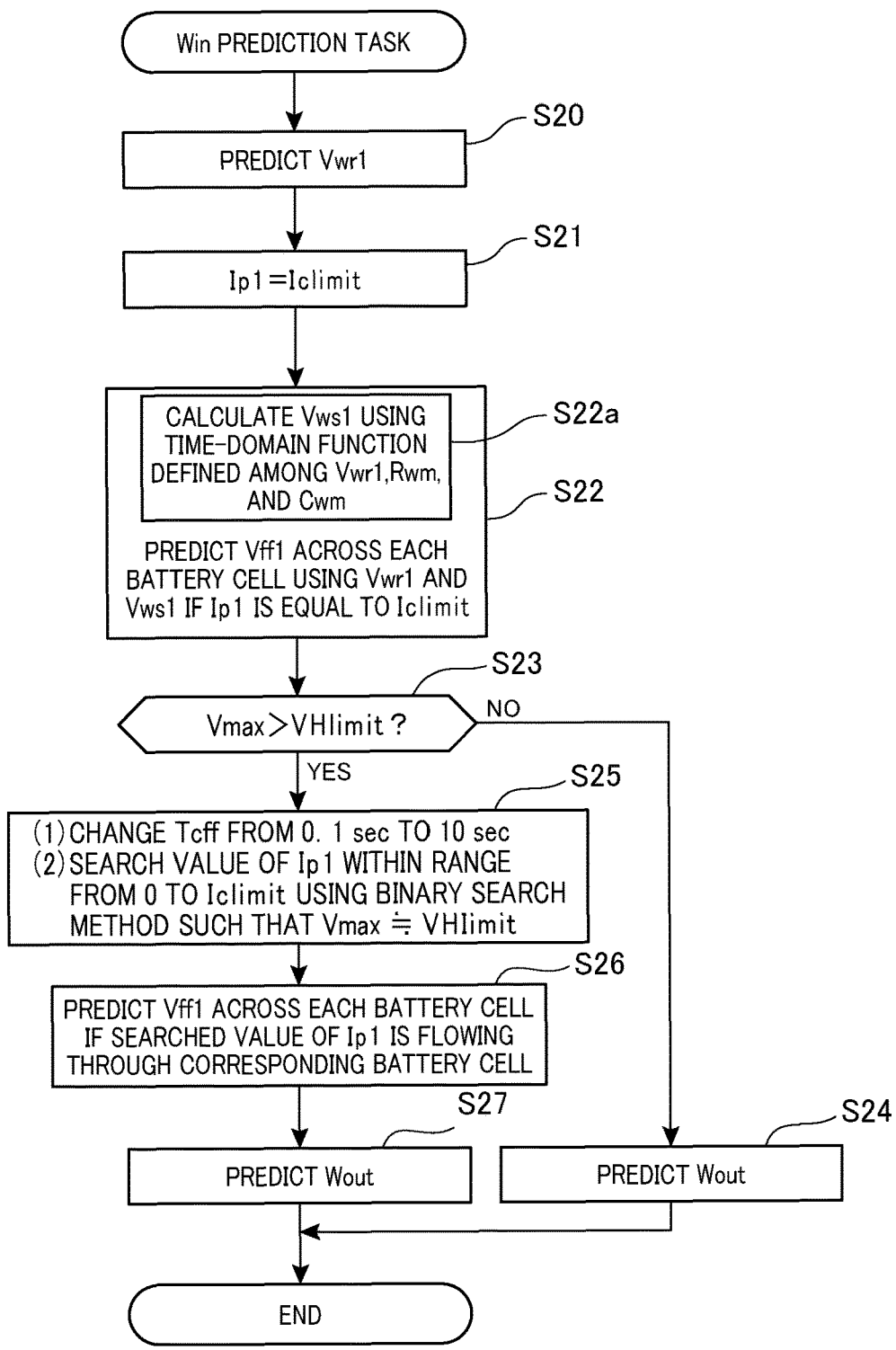
FIG. 16 is a flowchart schematically illustrating an example of the sequence of a Win prediction task carried out by the CPU of the battery ECU illustrated in FIG. 1.

The following describes the Win prediction task with reference to FIGS. 14 to 16. The Win prediction task aims to predict maximum power continuously chargeable in the battery pack 20 over a predetermined charge duration Tcff from a specified prediction time, for example, the present time. The embodiment sets the charge duration Tcff to be equal to, for example, the task period of the power predictor 33, which is set to 0.1 seconds.

The following specifically describes how the CPU 30a, i.e. its power predictor 33, performs the Win prediction task with reference to FIG. 16. As described above, the power predictor 33 repeatedly performs the Win prediction task every task period.

When starting the Win prediction task, the power predictor 33, which serves as, for example, a remaining voltage predictor, predicts a value of a total remaining voltage Vwr1 in step S20. The total remaining voltage Vwr1 represents the total of the remaining polarization voltages of all the battery cells 20a after the lapse of the charge duration Tcff from the specified prediction time. For example, the power predictor 33 predicts a value of the total remaining voltage Vwr1 in accordance with the above equation [eq25] in which the total remaining voltage Vwr and the discharge duration Tdff are respectively substituted by the total remaining voltage Vwr1 and the charge duration Tcff in step S20.

Next, the power predictor 33 sets a supposed value of a charge current Ip1 for each battery cell 20a to its predetermined allowable charge upper limit Iclimit in step S21. The allowable upper change limit Iclimit represents a positive value.

Subsequently, the power predictor 33 serves as, for example, a second polarization voltage calculator in step S22a, calculates a value of a future polarization voltage Vws1 in accordance with the above continuous time-domain function, i.e. time-domain continuous equation, [eq27] in which the discharge duration Tdff is substituted by the charge duration Tcff.

Then, the power predictor 33 serves as, for example, a first charge terminal-voltage calculator in step S22. Specifically, the power predictor 33 predicts a terminal voltage Vff1 across each battery cell 20a at the timing when the charge duration Tcff will have elapsed since the specified prediction time if the charge current Ip having the allowable charge upper limit Iclimit is flowing through the corresponding battery cell 20a over the charge duration Tcff in step S22. For example, the power predictor 33 predicts the terminal voltage Vff1 across each battery cell 20a in accordance with the above equations [eq26] and [eq27] in which the total remaining voltage Vwr, the future polarization voltage Vws, and the discharge duration Tdff are respectively substituted by the total remaining voltage Vwr1, the future polarization voltage Vws1, and the charge duration Tcff in step S22.

Following the operation in step S22, the power predictor 33 selects a maximum value Vmax from the terminal voltages Vff1 across all the battery cells 20a in step S23. Then, the power predictor 33 determines whether the selected maximum value Vmax is more than the allowable upper limit voltage VHlimit in step S23.

FIG. 14 schematically illustrates an example of the situation where the determination in step S23 is negative. FIG. 14 shows that the maximum value Vmax of the battery cell 20a having the curve C1 is equal to or less than the allowable upper limit voltage VHlimit.

Upon determining that the selected maximum value Vmax is equal to or less than the allowable upper limit voltage VHlimit (NO in step S23), the power predictor 33 determines that the terminal voltages Vff1 across all the battery cells 20a are equal to or less than the allowable upper limit voltage VHlimit in step S23.

Then, the power predictor 33, which serves as, for example, a first inputtable power predictor, calculates the total sum Vff1(Σ) of the terminal voltages Vff1 across all the battery cells 20a predicted in step S22, and calculates the product of the total sum Vff1(Σ) and the supposed value, i.e. the allowable charge upper limit Iclimit, of the charge current Ip1 in step S24.

Consequently, the power predictor 33 predicts the calculated product of the total sum Vff1(Σ) and the allowable charge upper limit Iclimit of the charge current Ip1 as a value of the allowable input power Win at the timing when the charge duration Tcff will have elapsed since the specified prediction time in step S24.

Otherwise, upon determining that the selected maximum value Vmax is more than the allowable upper limit voltage VHlimit (YES in step S23), the sequence of the Win prediction task proceeds to step S25.

In step S25, the power predictor 33 serves as, for example, a charge current searcher. Specifically, in step S25, the power predictor 33 changes the value of the charge duration Tcff from 0.1 seconds to ten seconds that is equal to the discharge duration Tdff. Thereafter, the power predictor 33 calculates, as a maximum charge current Icmax, a value of the charge current Ip1; the calculated value of the charge current Icmax is required to cause the maximum value Vmax in the terminal voltages VD at the timing when the charge duration Tcff will have elapsed since the specified prediction time to be set to the allowable upper limit voltage VHlimit. The maximum charge current Icmax is calculated to be equal to or lower than the absolute charge upper limit Iclimit.

For example, the power predictor 33 calculates the maximum charge current Icmax using one of known search methods in step S25. In particular, the power predictor 33 according to the embodiment calculates the maximum charge current Icmax using the known binary search method. That is, the maximum charge current Icmax represents a maximum value of the charge current Ip1; the maximum value of the charge current Ip1 satisfies both the voltage and current limit ranges of each battery cell 20a.

Specifically, the power predictor 33 searches for a value of the charge current Ip1 within the range from zero to the allowable charge upper limit Iclimit using the known binary search method such that the interval between the maximum value Vmax and the allowable upper limit voltage VHlimit is sufficiently small, in other words, the maximum value Vmax is sufficiently close to the allowable upper limit voltage Vahlimit in step S25. Then, the power predictor 33 determines the searched value of the charge current Ip1 as the maximum charge current Icmax, and sets the maximum charge current Icmax as the supposed value of the charge current Ip1. That is, the supposed value Icmax is assumed to flow through each battery cell 20a over the charge duration Tcff.

For the sake of simplicity, FIG. 15 illustrates only two current-voltage characteristic curves C11 and C12 for individually two battery cells 20a. FIG. 15 illustrates an example of the supposed value of the charge current Ip1 set in step S25.

Following the operation in step S25, the power predictor 33 serves as, for example, a second charge terminal-voltage predictor in step S26. Specifically, the power predictor 33 predicts the terminal voltage Vff1 across each battery cell 20a at the timing when the charge duration Tcff will have elapsed since the specified prediction time if the supposed value, i.e. the maximum charge current Icmax, of the charge current Ip1 determined in step S25 is flowing through the corresponding battery cell 20a over the charge duration Tcff in step S26.

Following the operation in step S26, the power predictor 33 serves as, for example, a second inputtable power predictor in step S27. Specifically, in step S27, the power predictor 33 calculates the total sum Vff1($\Sigma$) of the terminal voltages Vff1 across all the battery cells 20a predicted in step S26. In step S27, the power predictor 33 calculates the product of the total sum Vff1($\Sigma$) and the supposed value, i.e. the maximum charge current Icmax, of the charge current Ip1, determined in step S25 in step S27. Consequently, the power predictor 33 predicts the calculated product of the total sum Vff1($\Sigma$) and the maximum charge current Icmax of the charge current Ip1 as a value of the allowable input power Win at the timing when the charge duration Tcff will have elapsed since the specified prediction time in step S27.

The following describes the reason why the length of the charge duration Tcff is changed upon the affirmative determination is made in step S23 while comparing the charge duration Tcff in the prediction of the allowable input power Win with the discharge duration Tdff in the prediction of the allowable output power Wout.

First, let us describe the discharge duration Tdff in the prediction of the allowable output power Wout.

As illustrated in FIG. 14, let us assume that the value of the discharge current Ip at the specified prediction time, i.e. a present operating point, is less than the allowable discharge upper limit Idlimit of the discharge current Ip, which is used for prediction of the allowable output power Wout. In this assumption, the terminal voltage Vff across each battery cell 20a gradually decreases over time during the battery pack 20 being discharged.

For this reason, the discharge current Ip at a future operating point after the lapse of the discharge duration Tdff from the present operating point is kept to be equal to or less than the allowable discharge upper limit Idlimit even if (1) The power predictor 33 calculates a value of the allowable output power Wout at the future operating point (2) The battery cell 20a continuously discharges the allowable output power Wout from the present operating point for the discharge duration Tdff.

Next, let us describe the charge duration Tcff in the prediction of the allowable input power Win.

Let us assume that the selected maximum value Vmax is more than the allowable upper limit voltage VHlimit with the use of the allowable charge upper limit Iclimit of the charge current Ip1 for prediction of the allowable input power Win (YES in step S23). In this assumption, continuous charging of the battery pack 20 based on the allowable charge upper limit Iclimit of the charge current Ip1 results in the terminal voltage Vff1 across each battery cell 20a increasing. This increase in the terminal voltage Vff1 across each battery cell 20a results in the charged power in the battery pack 20 increasing.

Thus, the charged power in the battery pack 20 at the timing when the charge current Ip1 reaches the allowable charge upper limit Iclimit may be higher than the charged power in the battery pack 20 after the lapse of the charge duration Tcff from the specified prediction time. For this reason, if the battery pack 20 is charged based on the allowable input power Win, which is predicted from a future operating point after the lapse of the charge duration Tcff, the charge current Ip1 may pass over an operating point exceeding the allowable charge upper limit Iclimit. After passing over the operating point, the charge current Ip1 may transfer to an operating point matching with the predicted allowable input power Win. This is because each future polarization voltage Vws of the battery cell 20a increases over time up to a convergent value expressed by the product of the charge current Ip1 and the corresponding diffusion resistance component Rwm of the battery cell 20a, so that the terminal voltage VD across the battery cell 20a increases over time.

In particular, an increase of the charge duration Tcff may increase the risk of the charge current Ip1 exceeding the allowable charge upper limit Iclimit. In order to address the risk, the power predictor 33 sets the charge duration Tcff to 0.1 seconds corresponding to the task period, which are lower than ten seconds (see step S25).

On the other hand, let us assume that the selected maximum value Vmax is equal to or less than the allowable upper limit voltage VHlimit with the use of the allowable charge upper limit Iclimit of the charge current Ip1 for prediction of the allowable input power Win (NO in step S23). In this assumption, as illustrated in FIG. 15, the maximum charge current Icmax of the charge current Ip1, which is used for prediction of the allowable input power Win, I is likely to be away from the allowable charge upper limit Iclimit. For this reason, the charge current Ip1, which is transferring from a present operating point to a future operating point after the lapse of the charge duration Tcff from the present operating point, is likely to be kept lower than the allowable charge upper limit Iclimit. Thus, if the selected maximum value Vmax is equal to or less than the allowable upper limit voltage VHlimit with the use of the allowable charge upper limit Iclimit of the charge current Ip1 for prediction of the allowable input power Win (NO in step S23), there is no need to set the charge duration Tcff to be shorter than ten seconds. Thus, the power predictor 33 skips the operation in step S25, thus maintaining the charge duration Tcff at ten seconds.

As described in detail above, the battery system 10 according to the embodiment includes the equivalent circuit model 45 of each battery cell 20a; the equivalent circuit model 45 is comprised of the DC resistance model 45b, the reaction impedance model 45b, and the diffusion impedance model 45d, which are connected in series to each other.

The reaction impedance model 45b includes the reaction resistance Rr of the corresponding battery cell 20a, and has a nonlinear relationship between the potential difference ΔV across the reaction resistance Rr and a current/flowing through the corresponding battery cell 20a; the nonlinearly relationship depends on the temperature of the corresponding battery cell 20a. More specifically, the reaction impedance model 45b is comprised of the reaction-resistance parameter β that is derived d from the Butler-Volmer equation and correlates with the exchange current density of the corresponding battery cell 20a.

The battery system 10 according to the embodiment is configured to calculate, based on the above-configured equivalent circuit model 45 of each battery cell 20a, (1) The open circuit voltage OCV across the corresponding battery cell 20a to thereby calculate, based on the open circuit voltage OCV across each battery cell 20a, a value of the SOC of the corresponding battery cell 20a (2) The terminal voltage Vff across each battery cell 20a to thereby predict the allowable output power Wout using the discharge current Ip flowing through the corresponding battery cell 20a (3) The terminal voltage Vff1 across each battery cell 20a to thereby predict the allowable input power Win using the charge current Ip1 flowing through the corresponding battery cell 20a.

This configuration enables the equivalent circuit model 45 to show the current-voltage characteristics of the battery cell 20a including nonlinear characteristics with a higher accuracy as compared to another equivalent circuit model including a single RC model of each battery cell. This enables the battery system 10 to calculate at least one power output parameter of each battery cell 20a or the battery pack 20 with a higher accuracy as compared with another equivalent circuit model including a single RC model of each battery cell even in a low temperature region of the corresponding battery cell.

In particular, the above configuration of the equivalent circuit model 45 enables the battery system 10 to calculate (1) The SOC of each battery cell 20a with a higher accuracy as compared with another equivalent circuit model including a single RC model of each battery cell even in a low temperature region of the corresponding battery cell (2) At least one of the allowable input power Win and the allowable output power Wout with a higher accuracy as compared with another equivalent circuit model including a single RC model of each battery cell even in a low temperature region of the corresponding battery cell.

Additionally, the diffusion impedance model 45d is comprised of the four RC parallel circuits 45d1, 45d2, 45d3, and 45d4 connected in series to each other. That is, these RC parallel circuits 45d1, 45d2, 45d3, and 45d4 respectively have different time constants Rw1·Cw1, Rw2·Cw2, Rw3·Cw3, and Rw4·Cw4, and the different time constants Rw1·Cw1, Rw2·Cw2, Rw·Cw3, and Rw4·Cw4 enable the variations of the diffusion resistance and the variations of the diffusion capacitances to be expressed with a higher accuracy. This therefore enables the battery system 10 to calculate at least one power output parameter of each battery cell 20a or the battery pack 20 with a further higher accuracy as compared with another equivalent circuit model including a single RC model of each battery cell even in a low temperature region of the corresponding battery cell.

Moreover, the battery system 10 according to the embodiment calculates, in accordance with the above continuous time-domain equation [eq25] based on the RC parameters of the RC parallel circuits 45d1, 45d2, 45d3, and 45d4, the total remaining voltage Vwr during the battery pack 20 being discharged. The total remaining voltage Vwr represents the total of the remaining polarization voltages of all the battery cells 20a after the lapse of the discharge duration Tdff from a specified prediction time. Then, the battery system 10 predicts a value of the future polarization voltage Vws in accordance with the above continuous time-domain equation [eq27] based on the RC parameters of the RC parallel circuits 45d1, 45d2, 45d3, and 45d4 during the battery pack 20 being discharged. The future polarization voltage Vws is generated across the diffusion impedance model 45d at the timing when the discharge duration Tdff will have elapsed since the specified prediction time if no charges are stored in the capacitance components Cw1, Cw2, Cw3, and Cw4.

The battery system 10 predicts a value of the allowable output power Wout using the calculated total remaining voltage Vwr and the predicted future polarization voltage Vws.

Similarly, the battery system 10 according to the embodiment calculates, in accordance with the above continuous time-domain equation [eq25] based on the RC parameters of the RC parallel circuits 45d1, 45d2, 45d3, and 45d4, the total remaining voltage Vwr1 during the battery pack 20 being charged. The total remaining voltage Vwr1 represents the total of the remaining polarization voltages of all the battery cells 20a after the lapse of the charge duration Tdff1 from a specified prediction time. Then, the battery system 10 predicts a value of the future polarization voltage Vws1 in accordance with the above continuous time-domain equation [eq27] based on the RC parameters of the RC parallel circuits 45d1, 45d2, 45d3, and 45d4 during the battery pack 20 being charged. The future polarization voltage Vws1 is generated across the diffusion impedance model 45d at the timing when the charge duration Tdff1 will have elapsed since the specified prediction time if no charges are stored in the capacitance components Cw1, Cw2, Cw3, and Cw4.

The battery system 10 predicts a value of the allowable input power Win using the calculated total remaining voltage Vwr1 and the predicted future polarization voltage Vws1.

That is, the above battery system 10 enables a value of each of the total remaining voltage Vwr and the predicted future polarization voltage Vws to be calculated in a single calculation based on a corresponding one of the continuous time-domain equations [eq25] and [eq27]. Similarly, the above battery system 10 enables a value of each of the total remaining voltage Vwr1 and the predicted future polarization voltage Vws1 to be calculated in a single calculation based on a corresponding one of the continuous time-domain equations [eq25] and [eq27].

This therefore predicts a value of each of the allowable output power Wout and the allowable input power Win with a higher accuracy while maintaining sufficiently small calculation load.

The embodiment of the present disclosure can be modified as follows.

The battery system 10 according to the embodiment is configured such that the battery pack 20 and the battery ECU 30 are separated from each other, but the battery ECU 30 can be integrated in the battery pack 20.

The power predictor 33 calculates each of the absolute maximum discharge current Idmax and the maximum charge current Icmax using a known binary search method, but can calculate it using one of known search methods, such as a golden section search.

The discharge duration Tdff can be set to a value different from 10 seconds, such as 2 seconds, 5 seconds, or 30 seconds, preferably within the range from several seconds to several tens of seconds. The same is true for the charge duration Tcff.

The diffusion impedance model 45d can be comprised of a plurality of RC parallel circuits connected in series to each other; the number of the RC parallel circuits is not limited to the four. The diffusion impedance model 45d can be comprised of a single RC parallel circuit for simplification of the circuit structure of the diffusion impedance model 45d.

Another battery cell, such as a nickel-hydride cell, can be used for each of the battery cells 20a, which constitute the battery pack 20. A single secondary battery, such as lithium-ion secondary battery or nickel-hydride secondary battery, can be used as the battery pack 20.

The temperature of the battery pack 20 used in the embodiment is not limited to the value measured by the temperature sensor 22. Specifically, a value of the battery pack 20 predicted by one of known prediction methods can be used as the temperature of the battery pack 20.

The apparatuses for calculating a power parameter of a secondary battery according to the embodiment and its modifications can be applied to various devices or machines.

While the illustrative embodiment of the present disclosure has been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A battery system for predicting a target power parameter of battery cells, the battery system comprising:
 a secondary battery configured to receive and supply power;
 a plurality of sensors each measuring variables of the battery system;
 a memory; and
 a processor operatively coupled to the secondary battery, the plurality of sensors, and the memory, the processor being configured to:
  calculate a present polarization voltage across the secondary battery at a specified prediction time based on an equivalent circuit model of the secondary battery, the equivalent circuit model including:
   a DC resistance model representing a DC resistance of the secondary battery;
   a reaction impedance model representing a reaction resistance of the secondary battery and having a nonlinear relationship between a first potential difference across the reaction resistance and a current flowing through the secondary battery, the nonlinearly relationship depending on a temperature of the secondary battery; and
   a diffusion impedance model representing a diffusion impedance of the secondary battery and including at least one RC parallel circuit, the at least one RC parallel circuit including a diffusion resistance and a diffusion capacitance connected in parallel to each other, the DC resistance model, the reaction impedance model, and the diffusion impedance model being connected in series to each other;
  calculate the present polarization voltage across the secondary battery in accordance with a predetermined function defined among the present polarization voltage, the diffusion resistance, and the diffusion capacitance;
  calculate, in accordance with a first continuous time-domain function, a predicted remaining voltage across the secondary battery at a time after a predetermined time since the specified prediction time for the target power parameter, the first continuous time-domain function being defined by the diffusion resistance, the diffusion capacitance, the present polarization voltage, and the future remaining voltage;
  calculate, in accordance with a second continuous time-domain function, a predicted polarization voltage across the secondary battery at the timing after the predetermined time since the specified prediction time, the second continuous time-domain function being defined by the future polarization voltage, the diffusion resistance, and the diffusion capacitance;
  determine a value of the target power parameter at the timing after the predetermined time since the specified prediction time in accordance with: the predicted remaining voltage, the predicted polarization voltage, the first potential difference across the reaction resistance, a second potential difference across the DC resistance model, and a value of the current flowing through the secondary battery measured by one of the plurality of sensors; and
  control performance of the secondary battery in accordance with the determined value of the target power parameter.

2. The battery system according to claim 1, wherein the reaction impedance model is derived from a Butler-Volmer equation, and includes a reaction resistance parameter correlating with an exchange current density of the secondary battery.

3. The battery system according to claim 2, wherein the reaction resistance parameter satisfies the following equation:

$$\Delta V = \frac{\alpha}{\gamma} T \cdot \sinh^{-1}(\beta \cdot \gamma \cdot I)$$

Where each of α and γ is a constant, β represents the reaction resistance parameter, I represents the current flowing through the secondary battery, T represents the temperature of the secondary battery, and ΔV represents the first potential difference across the reaction resistance.

4. The battery system according to claim 1, wherein:
the current is a discharge current flowing through the secondary battery;
the secondary battery includes a plurality of battery cells connected in series to each other; and
the processor is configured to:
   calculate, as the present polarization voltage across the secondary battery, a present polarization voltage across each of the battery cells;
   calculate a first terminal voltage across each of the battery cells at the future timing after a predetermined discharge duration that is the predetermined time since the specified prediction time when an allowable upper limit value of the discharge current is flowing through the corresponding battery cell over the predetermined discharge duration;
   calculate, as the value of the target power parameter, a first value of outputtable power from the secondary battery at the future timing when the predetermined discharge time since the specified prediction time according to the sum of all the first terminal voltages and the allowable upper limit value of the discharge current when a minimum value in all the first terminal voltages is equal to or more than a predetermined allowable lower limit voltage for the battery cells;
   determine a maximum value of the discharge current required to cause the minimum value of all the first terminal voltages to be set to the allowable lower limit voltage when the minimum value in all the terminal voltages is less than the predetermined allowable lower limit voltage for the battery cells, the maximum value of the discharge current being equal to or lower than the allowable upper limit value of the discharge current;
   calculate a second terminal voltage across each of the battery cells at the time after the predetermined discharge time since the specified prediction time when the maximum value of the discharge current is flowing through the corresponding battery cell over the predetermined discharge duration; and
   calculate, as the value of the target power parameter, a second value of the outputtable power from the secondary battery at the time after the predetermined discharge time since the specified prediction time according to the sum of all the second terminal voltages and the maximum value of the discharge current.

5. The battery system according to claim 4, wherein the processor is configured to determine the maximum discharge value of the discharge current within a range from zero to the allowable upper limit value of the discharge current inclusive.

6. The battery system according to claim 1, wherein:
the current is a charge current flowing through the secondary battery;
the secondary battery includes a plurality of battery cells connected in series to each other; and
the processor is configured to:
   calculate, as the present polarization voltage across the secondary battery, a present polarization voltage across each of the battery cells;
   calculate a first terminal voltage across each of the battery cells at the time after a predetermined first value of a charge duration that is the predetermined time since the specified prediction time when an allowable upper limit value of the charge current is flowing through the corresponding battery cell over the predetermined first value of the charge duration;
   calculate, as the value of the target power parameter, a first value of inputtable power to the secondary battery at the time after the predetermined first value of the charge time since the specified prediction time according to the sum of all the first terminal voltages and the allowable upper limit value of the charge current when a maximum value in all the first terminal voltages is equal to or less than a predetermined allowable upper limit voltage for the battery cells;
   determine, when the maximum value in all the first terminal voltages is more than the predetermined allowable upper limit voltage for the battery cells, for a maximum value of the charge current required to cause a maximum value of all modified terminal voltages across the battery cells to be set to the allowable upper limit voltage, the modified terminal voltage across each of the battery cells being calculated at the time after the predetermined second value of the charge time since the specified prediction time, the maximum value of the charge current being equal to or lower than the allowable upper limit value of the charge current, the second value of the charge duration being set to be longer than the first value of the charge duration;
   calculate a second terminal voltage across each of the battery cells at the time after the predetermined second value of the charge time since the specified prediction time when the maximum value of the charge current is flowing through the corresponding battery cell over the predetermined second value of the charge duration; and
   calculate, as the value of the target power parameter, a second value of the inputtable power to the secondary battery at the time after the predetermined second value of the charge time since the specified prediction time according to the sum of all the second terminal voltages and the maximum value of the charge current.

7. The battery system according to claim 6, wherein the processor is configured to determine the maximum charge value of the charge current within a range from zero to the allowable upper limit value of the charge current inclusive.

8. The battery system according to claim 1, wherein:
the at least one RC parallel circuit includes N RC parallel circuits where N is an integer equal to or more than 2, the diffusion resistances of the N RC parallel circuits being referred to as $Rw_m$ where $m=1, 2, \ldots,$ and N, the diffusion capacitances of the N RC parallel circuits being referred to as $Cw_m$ where $m=1, 2, \ldots,$ and N;
the processor is configured to calculate, as the present polarization voltage across the secondary battery, present polarization voltage values $Vw_m$ for the respective N RC parallel circuits; and
the processor is configured to calculate the future remaining voltage across the secondary battery in accordance with the following equation:

$$Vwr = \sum_{m=1}^{N}\left[Vwm \cdot \exp\left(-\frac{Tdff}{Cwm \cdot Rwm}\right)\right]$$

Where Tdff represents the predetermined duration; and the processor is configured to calculate the future polarization voltage across the secondary battery in accordance with the following equation:

$$Vws = \sum_{m=1}^{N}(Ip \times Rwm)\left\{1 - \exp\left(-\frac{Tdff}{Cwm \times Rwm}\right)\right\}$$

Where Ip represents the current flowing through the secondary battery for the predetermined duration from the specified prediction time.

9. The battery system according to claim 1, wherein the processor is configured to:
calculate an amount of change of an open circuit voltage across the secondary battery during the predetermined duration from the specified prediction time; and
calculate a value of the target power parameter at the time after the predetermined time since the specified prediction time in accordance with the amount of change of the open circuit voltage in addition to the future remaining voltage, the future polarization voltage, the first potential difference across the reaction resistance, and the second potential difference across the DC resistance model.

10. A battery system for predicting a target power parameter of battery cells, the battery system comprising:
a secondary battery configured to receive and supply power;
a current sensor measuring a current flowing through the secondary battery;
a memory; and
a processor operatively coupled to the secondary battery, the current sensor, and the memory, the processor being configured to:
calculate a value of the target power parameter at a specified prediction time based on an equivalent circuit model of the secondary battery, the equivalent circuit model including:
a DC resistance model representing a DC resistance of the secondary battery;
a reaction impedance model representing a reaction resistance of the secondary battery and having a nonlinear relationship between a potential difference across the reaction resistance and the current flowing through the secondary battery, the nonlinearly relationship depending on a temperature of the secondary battery; and
a diffusion impedance model representing a diffusion impedance of the secondary battery and including a plurality of RC parallel circuits, each of the RC parallel circuits including a diffusion resistance and a diffusion capacitance connected in parallel to each other, the DC resistance model, the reaction impedance model, and the diffusion impedance model being connected in series to each other;
determine a value of the target power parameter as a function of: the DC resistance of the DC resistance model, the reaction resistance of the reaction impedance model, the diffusion resistance and the diffusion capacitance of each of the RC parallel circuits, and a value of the current through the secondary battery measured by the current sensor; and
control performance of the secondary battery in accordance with the determined value of the target power parameter.

11. The battery system according to claim 10, wherein the reaction impedance model is derived from a Butler-Volmer equation, and includes a reaction resistance parameter correlating with an exchange current density of the secondary battery.

12. The battery system according to claim 11, wherein the processor is configured to:
calculate a first potential difference that is the potential difference across the reaction resistance as a function of the reaction resistance parameter;
calculate a second potential difference across the DC resistance according to the DC resistance and the current measured by the current sensor;
calculate a third potential difference across each of the RC parallel circuits as a function of the diffusion resistance and the diffusion capacitance of the corresponding one of the RC parallel circuits; and
determine a value of the target power parameter as a function of the first, second, and third potential differences and the current measured by the current sensor.

13. The apparatus according to claim 1, wherein:
the memory stores information indicating a relationship between the reaction resistance of the secondary battery and the temperature of the secondary battery; and
the processor is configured to calculate the reaction resistance based on the information stored in the memory.

14. The apparatus according to claim 13, wherein:
the plurality of sensors include a temperature sensor that measures the temperature of the secondary battery;
the stored information in the memory includes a map indicating a liner function between a natural logarithm of the reaction resistance and a reciprocal of an absolute temperature of the secondary battery; and
the processor is configured to:
determine a reciprocal of the absolute temperature of the secondary battery based on the temperature of the secondary battery measured by the temperature sensor;
determine a natural logarithm of the reaction resistance as a function of the map and the reciprocal of the absolute temperature; and
calculate an exponential of the natural logarithm of the reaction resistance, which determines the reaction resistance.

* * * * *